(12) United States Patent  
Kawamura et al.

(10) Patent No.: US 8,227,980 B2
(45) Date of Patent: Jul. 24, 2012

(54) ORGANIC EL DEVICE

(75) Inventors: Norifumi Kawamura, Kyoto (JP); Kohichi Mori, Kyoto (JP); Hideyuki Kobayashi, Kyoto (JP); Hiroshi Takehisa, Kyoto (JP)

(73) Assignee: Rohm Co., Ltd., Kyoto (JP)

( * ) Notice: Subject to any disclaimer, the term of this patent is extended or adjusted under 35 U.S.C. 154(b) by 50 days.

(21) Appl. No.: 12/736,454

(22) PCT Filed: Mar. 31, 2009

(86) PCT No.: PCT/JP2009/056693
§ 371 (c)(1),
(2), (4) Date: Oct. 8, 2010

(87) PCT Pub. No.: WO2009/125696
PCT Pub. Date: Oct. 15, 2009

(65) Prior Publication Data
US 2011/0025197 A1 Feb. 3, 2011

(30) Foreign Application Priority Data

Apr. 11, 2008 (JP) ................ P2008-103813
Apr. 11, 2008 (JP) ................ P2008-103816

(51) Int. Cl.
*H01J 1/62* (2006.01)
(52) U.S. Cl. ...................... 313/506; 313/504
(58) Field of Classification Search ............... 313/498, 313/504, 506
See application file for complete search history.

(56) References Cited

U.S. PATENT DOCUMENTS

| 2005/0017649 A1 | 1/2005 | Tanabe |
| 2005/0077818 A1 | 4/2005 | Hieda et al. |
| 2005/0122043 A1 | 6/2005 | Kato et al. |

FOREIGN PATENT DOCUMENTS

| JP | 2001-085158 A | 3/2001 |
| JP | 2002-299047 A | 10/2002 |
| JP | 2003-280551 A | 10/2003 |
| JP | 2005-100916 A | 4/2005 |
| JP | 2005-158371 A | 6/2005 |
| JP | 2005-338419 A | 12/2005 |
| JP | 2006-127916 A | 5/2006 |
| JP | 2007-173519 A | 7/2007 |
| JP | 2007-173564 A | 7/2007 |
| JP | 2007-311159 A | 11/2007 |
| WO | WO-2008/062645 A1 | 5/2008 |

*Primary Examiner* — Vip Patel
(74) *Attorney, Agent, or Firm* — Rabin & Berdo, P.C.

(57) ABSTRACT

The organic EL device (1) comprises: a substrate (2); a light emitting unit formed on the substrate (2), and including an anode (11), a cathode (7) having anelectric resistance lower than that of the anode (11), an organic light emitting layer (6) formed between the anode (11) and the cathode (7); an anode terminal (12) formed on the substrate (2) and connected to the anode (11), and a cathode terminal (16) formed on the substrate (2) and connected to the cathode (7). A surface of the anode terminal (12) connected to the external is applied into an anode connecting surface (12a), and a surface of the cathode terminal (16) connected to the external is applied into a cathode connecting face (16a). The size (S1) of the anode connecting surface (12a) is larger than the size (S2) of the cathode connecting surface (16a).

19 Claims, 21 Drawing Sheets

ORGANIC EL DEVICE

TECHNICAL FIELD

The present invention relates to an organic electroluminescence (EL) device having an organic light emitting layer inserted into a pair of electrodes from which electric resistance is different.

Also, the present invention relates to an organic EL device having a light transmissible electrode.

BACKGROUND ART

An organic EL device having an organic light emitting layer is known conventional. Moreover, in order to use for lighting etc., it is in the tendency that a plane area of an organic EL device enlarges. In such the case, there was a problem that a mottle of a luminance distribution occurred within a surface of a light emitting surface in an organic EL device. Accordingly, it is proposed the technology for reducing the mottle of the luminance distribution of such the organic EL device.

Patent Literature 1 discloses an organic EL lighting device having a substrate, an anode formed on the substrate, an organic light emitting layer, and a cathode. In the organic EL lighting device, the anode is formed by a plurality of band-shaped transmissible electrodes. Then, the wiring from external connected to an edge part of the anode is connected alternately to an end of a different side.

Moreover, Patent Literature 2 discloses an organic EL device unit in which a plurality of organic EL devices is formed on one substrate. In the organic EL device unit, a gap is formed between adjoining organic EL devices so that the adjoining anode and cathode of the organic EL device may not electrically be connected.

Also, an organic EL device having a light transmissible electrode and an organic light emitting layer is known.

Patent Literature 3 discloses an organic EL device having: a substrate; a first electrode that can transmit the light formed on the substrate; an organic light emitting layer formed on the first electrode; a second electrode formed on the organic light emitting layer; an auxiliary electrode for supplying an electric charge to the second electrode on a central part of the organic light emitting layer. The first electrode is formed in surface shape or band shape in the organic EL device. Then, an electric charge is injected into the first electrode from a peripheral part or an edge part. In the organic EL device of Patent Literature 3, the light which emitted by the organic light emitting layer transmits the first electrode and the substrate, and is irradiated to external.

Patent Literature 4 discloses an organic EL device having: a substrate; a first feed unit formed on the substrate; a first planar electrode that can transmit light, the first feed unit is connected to the central part of the first electrode; a organic light emitting layer formed on the first electrode; and a second planar electrode formed on the organic light emitting layer. In the organic EL device of Patent Literature 4, the light which emitted by the organic light emitting layer transmits the first electrode and the substrate, and is irradiated to external.

Patent Literature 1: Japanese Patent Application Laying-Open Publication No. 2007-173519

Patent Literature 2: Japanese Patent Application Laying-Open Publication No. 2007-173564

Patent Literature 3: Japanese Patent Application Laying-Open Publication No. 2006-127916

Patent Literature 4: Japanese Patent Application Laying-Open Publication No. 2007-311159

SUMMARY OF INVENTION

Technical Problem

However, in the organic EL lighting device disclosed in Patent Literature 1, since a hole is not injected in the region in which the anode is not formed, the light is not emitted. Accordingly, in the organic EL lighting device disclosed in Patent Literature 1, there is a problem that a mottle of the luminance distribution becomes large between the region in which the band-shaped anode is formed, and the region in which the anode is not formed. Moreover, in the organic EL lighting device disclosed in Patent Literature 1, the anode is formed by the transmissible electrode of large resistance. Accordingly, also in the region in which the band-shaped anode is formed, the hole cannot reach easily and luminance becomes small to the edge part of the side to which the wiring from external is not connected. Accordingly, there also is a problem that the mottle of luminance distribution becomes large.

Also, in the organic EL device unit disclosed in Patent Literature 2, the light is not emitted between each the organic EL device. Accordingly, in the organic EL device unit disclosed in Patent Literature 2, there is a problem that the mottle of the luminance distribution is large between the region in which the organic EL device is formed and the region in which the organic EL device is not formed.

Also, the first electrode composed of material which can transmit light has high resistance in the organic EL device disclosed in Patent Literature 3. Then, since the electric charge is injected into the first electrode from the peripheral part or the edge part, it has few electric charges which arrive at the central part. Accordingly, there is a problem that little light is emitted and the mottle of luminance distribution is large, in the central part of the organic EL device.

Furthermore, in the organic EL device disclosed in Patent Literature 4, since the first feed unit is formed on the substrate, there is a problem that the first feed unit shieldes the light which proceeds to the substrate side, and thereby the light extracted to external decreases.

It is invented in order to solve the problems mentioned above, and the object of the present invention is to provide an organic EL device which can reduce the mottle of luminance distribution.

Also, it is invented in order to solve the problems mentioned above, and the object of the present invention is to provide an organic EL device which can reduce the mottle of luminance distribution, with improving extraction of light.

Solution to Problem

According to one aspect of the present invention, it is provide of an organic EL device comprising: a substrate; a light emitting unit formed on the substrate, and including a first electrode of surface shape, a second electrode of surface shape having electric resistance lower than that of the first electrode, and an organic light emitting layer formed between the first electrode and the second electrode; a first external terminal formed on the substrate and connected to the first electrode; and a second external terminal formed on the substrate and connected to the second electrode, wherein a surface of the first external terminal connected to an external is applied into the first connecting surface, a surface of the second external terminal connected to the external is applied into the second connecting surface, and a size of the first connecting surface is larger than a size of the second connecting surface.

According to another aspect of the present invention, it is provide of an organic EL device comprising: a substrate; a first electrode formed on the substrate and can transmit light; an organic light emitting layer formed on the first electrode; a second electrode formed on the organic light emitting layer, and an electrode apertural area is formed in a region, the organic light emitting layer being formed in the region; a conductive feed unit member disposed in an upper side of the second electrode by spacing gaps, and connected to the first electrode of an outside of the organic light emitting layer; and a convex connecting member inserted in the electrode apertural area in the state of non-contacted to the second electrode, and connected to the first electrode and the feed unit member.

Advantageous Effects of Invention

According to the present invention, the first connecting surface of the first external terminal connected to the first electrode of surface shape is formed more largely than the second connecting surface of the second external terminal connected to the second electrode having small electric resistance. Accordingly, in the present invention, since the carrier implanted into the first electrode can be increased, the carrier which reaches the center of the organic light emitting layer via the first electrode can be increased. As a result, in the present invention, since the light emitted in the center of the organic light emitting layer can be increased, the mottle of luminance distribution can be reduced.

Moreover, according to the present invention, the electric charge of the hole, the electron, etc. can be fed into the desire region of the first electrode by the convex connecting member and the conductive feed unit member. Accordingly, the electric charge can be implanted also into the region to which it is hard to feed the electric charge, such as the central part of the organic light emitting layer. As a result, the mottle of the luminance distribution of the light emitted in the organic light emitting layer can be reduced.

Furthermore, according to the present invention, the feed unit member is disposed to the opposite side of the first electrode sandwiching the organic light emitting layer. Accordingly, since the light irradiated to the external is not shielded after the light which transmits the first electrode by the feed unit member, the extraction of the light emitted by the organic light emitting layer can be improved.

DESCRIPTION OF EMBODIMENTS

Figure 1:
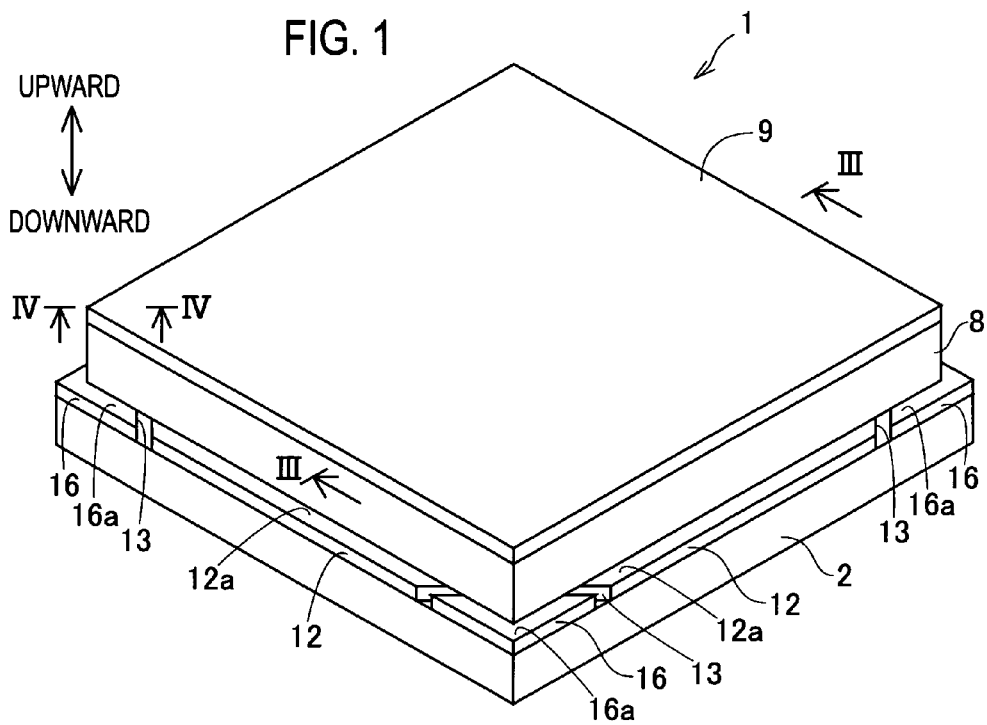
[FIG. 1] A whole perspective diagram showing an organic EL device according to a first embodiment

Next, embodiments of the present invention will be described with reference to drawings. In the description of the following drawings, the same or similar reference numeral is attached to the same or similar part. The embodiments shown in the following exemplify the device and method for materializing the technical idea of the present invention, and the technical idea of the invention does not specify the structure, arrangement, etc. of component parts as the following. Various changes can be added to the technical idea of this invention in scope of claims.

As shown in FIG. 1 to FIG. 5, an organic EL device 1 according to an embodiment of the present invention includes: a substrate 2; a light emitting unit formed on the substrate 2 and including an anode 11, a cathode 7 whose electric resistance is lower than that of the anode 11, and an organic light emitting layer 6 formed between the cathode 7 and the anode 11; an anode terminal 12 formed on the substrate 2 and connected with the anode 11; and a cathode terminal 16 formed on the substrate 2 and connected with the cathode 7. A surface of the anode terminal 12 connected with external is applied into an anode connecting surface 12a, and a surface of the cathode terminal 16 connected with external applied into a cathode connecting surface 16a. The size S1 of the anode connecting surface 12a is larger than the size S2 of the cathode connecting surface 16a.

(First Embodiment)

Figure 2:
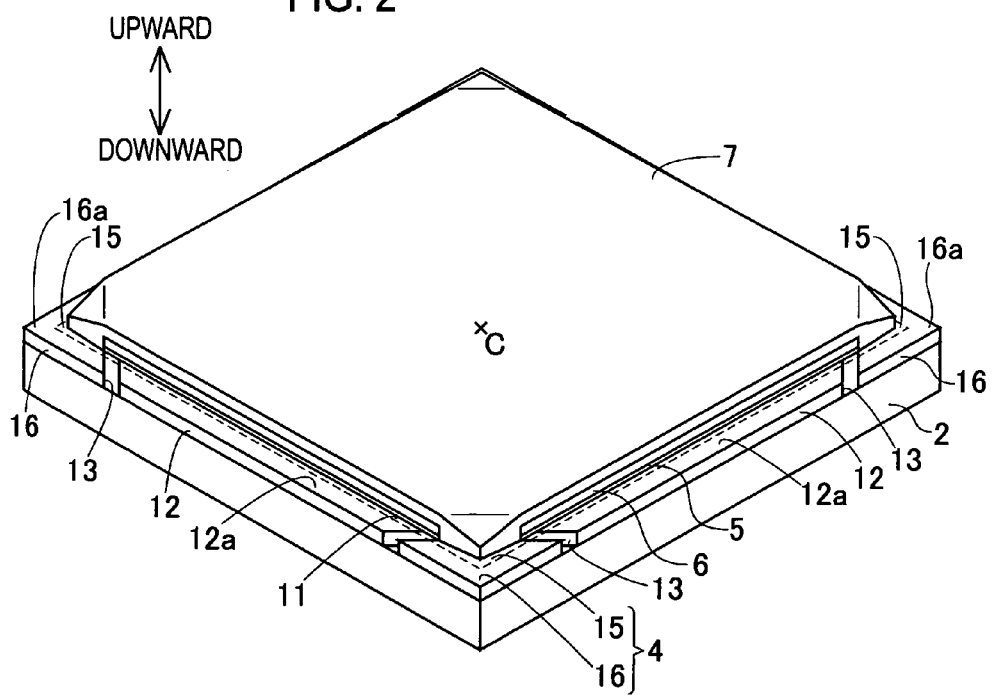
[FIG. 2] A whole perspective diagram of inside of the organic EL device
Figure 3:
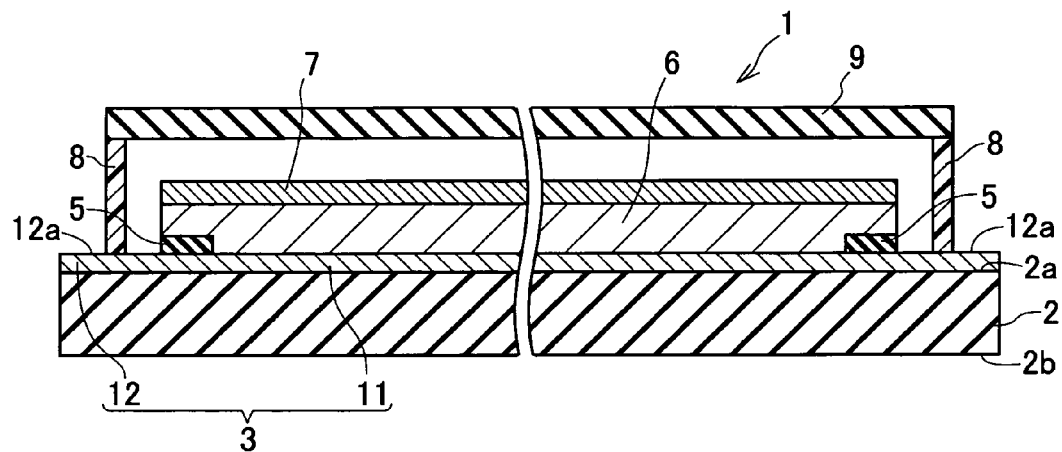
[FIG. 3] A cross-sectional diagram taken in line III-III of FIG. 1
Figure 4:
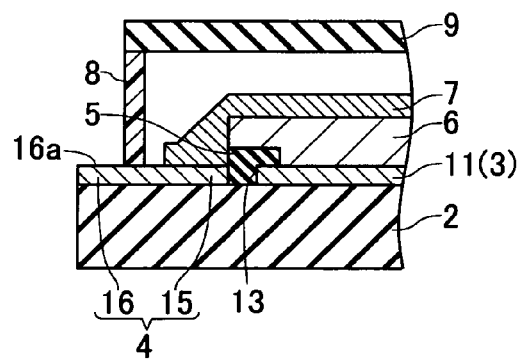
[FIG. 4] A cross-sectional diagram taken in line IV-IV of FIG. 1
Figure 5:
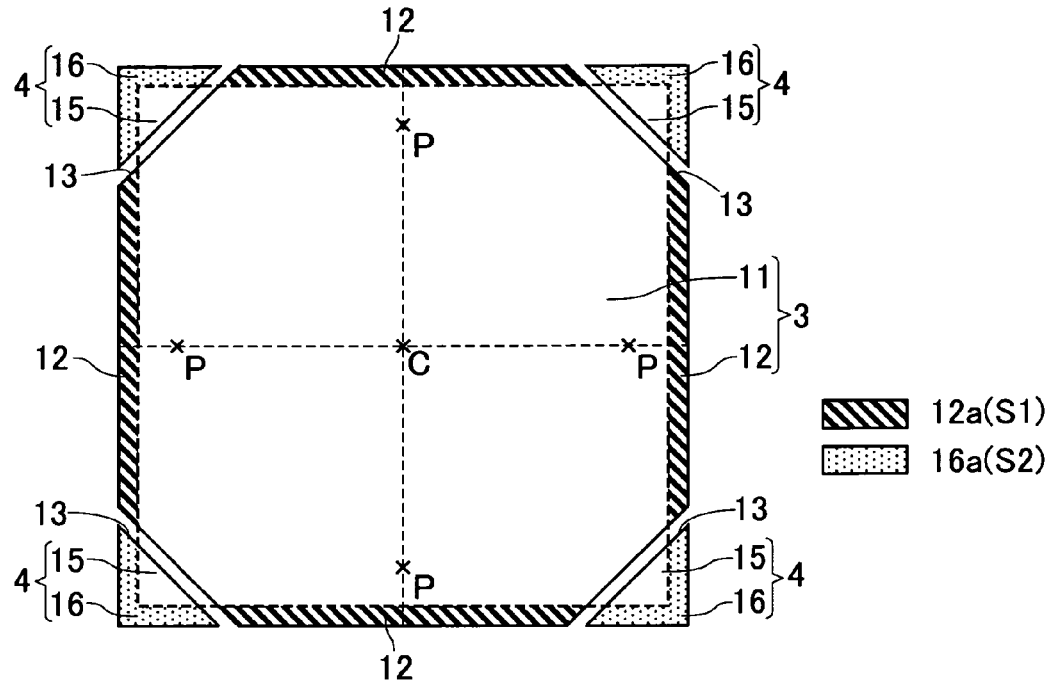
[FIG. 5] A top view of a first transmissible electrode and a second transmissible electrode

Hereinafter, a first embodiment that applied the present invention to a bottom emission type organic EL device will be described, with reference to drawings. FIG. 1 is a whole perspective diagram showing an organic EL device according to the first embodiment. FIG. 2 is a whole inside perspective diagram showing the organic EL device which removed a sealing plate. FIG. 3 is a cross-sectional diagram taken in line of FIG. 1. FIG. 4 is a cross-sectional diagram taken in line IV-IV of FIG. 1. FIG. 5 is a top view showing a first transmissible electrode and a second transmissible electrode. In the following explanation, upward and downward shown by an arrow of FIG. 1 is applied to an up-and-down direction.

As shown in FIG. 1 to FIG. 5, the organic EL device 1 according to the first embodiment includes: a substrate 2; a first transmissible electrode 3; a second four transmissible electrodes 4; an insulating layer 5; an organic light emitting layer 6; a cathode (second electrode) 7; a sealing material 8; and a sealing plate 9.

The substrate 2 is composed of a glass substrate which can transmit the light. The substrate 2 has the thickness of about 0.7 mm. The substrate 2 is formed according to plane view in the shape of a square whose one side is about 15 cm. The top surface of the substrate 2 is a growth principal surface 2a on which each layers 3-7 is formed. The bottom surface of the substrate 2 is a light extraction surface 2b from which the light is extracted.

The first transmissible electrode 3 is for injecting a hole into the organic light emitting layer 6. The first transmissible electrode 3 is formed on a growth principal surface 2a of the substrate 2. The first transmissible electrode 3 is formed in the octagonal shape on the region except for each near of vertices of the growth principal surface 2a. The first transmissible electrode 3 is formed on the surroundings of a center C of the organic light emitting layer 6, at point symmetry. The first transmissible electrode 3 is composed of indium tin oxide (ITO) having the thickness of about 150 nm which can transmit the light. The resistivity of ITO is the order of $10^{-4}$ Ω·cm.

The first transmissible electrode 3 includes an anode (first electrode) 11 and four anode terminals (first external terminal) 12.

The anode 11 is electrically connected with the bottom surface of the organic light emitting layer 6. The anode 11 is formed in surface shape so that the approximately whole surface of the bottom surface of the organic light emitting layer 6 may be covered. The anode 11 is formed in the inside of the sealing material 8.

The anode terminal 12 is for connecting an external power supply (not shown) and the anode 11. The anode terminal 12 is integrally formed with the anode 11. The anode terminal 12 is formed along with each side of the growth principal surface 2a of the substrate 2. The anode terminal 12 is formed in the outside of the sealing material 8. The four anode terminals 12 are formed in the surroundings of the center C of the organic light emitting layer 6, at point symmetry. The top surface of the anode terminal 12 is an anode connecting surface 12a connected to the external wiring etc. A soldering layer (not shown) for maintaining the whole surface at equivalent potential is formed on the approximately whole surface of the anode connecting surface 12a.

The second transmissible electrode 4 is for connecting the external power supply and the cathode 7. The second transmissible electrode 4 is formed near each vertex of the growth principal surface 2a of the substrate 2. The second transmissible electrode 4 is formed in the triangle according to plane view. The second transmissible electrode 4 is formed on the surroundings of the center C of the organic light emitting layer 6, at point symmetry. The second transmissible electrode 4 is composed of ITO having the thickness of about 150 nm which can transmit the light. Between the second transmissible electrode 4 and the first transmissible electrode 3, an insulating trench 13 for insulating each other electrically is formed.

The second transmissible electrode 4 includes a connecting unit 15 and a cathode terminal (second external terminal) 16.

The connecting unit 15 is formed in the inside of the sealing material 8. The vertex part of the cathode 7 is electrically connected to the connecting unit 15.

The cathode terminal 16 is formed in the shape of L character on each vertex of the growth principal surface 2a of the substrate 2. The cathode terminal 16 is formed in the outside of the sealing material 8. The four cathode terminals 16 are formed on the surroundings of the center C of the organic light emitting layer 6, at point symmetry. The top surface of the cathode terminal 16 is a cathode connecting surface 16a connected to the external wiring etc. A soldering layer (not shown) for maintaining the whole surface at equivalent potential is formed on the approximately whole surface of the cathode connecting surface 16a.

Here, the size S1 of the anode connecting surface 12a of the anode terminal 12 and the size S2 of the cathode connecting surface 16a of the cathode terminal 16 are explained, with reference to FIG. 5. In FIG. 5, the region hatched by thick lines is the anode connecting surface 12a. In FIG. 5, the region hatched by dots is the cathode connecting surface 16a. In addition, the dashed lines in FIG. 5 show the peripheral face of the sealing material 8. As shown in FIG. 5, in the organic EL device 1, the size S1 of the anode connecting surface 12a is formed so as to become larger than the size S2 of the cathode connecting surface 16a in order to enhance the injection of hole.

The insulating layer 5 is for suppressing a short circuit between the anode 11 and the cathode 7. The insulating layer 5 is formed in octagonal shape. The central part of the insulating layer 5 is opened in order to expose the anode 11. A part of insulating layer 5 is formed in the insulating trench 13. The insulating layer 5 is composed of $SiO_2$.

The organic light emitting layer 6 is for emitting the light. The organic light emitting layer 6 is formed in the octagonal shape whose periphery is in agreement with the periphery of the insulating layer 5, according to plane view. The organic light emitting layer 6 is formed in the state where it is electrically connected, on the anode 11. The hole transport layer and the electron transport layer are laminated sequentially from the anode 11 side in the organic light emitting layer 6. The hole transport layer is composed of a diphenylnaphthyldiamine (NPD) film having the thickness of about 50 nm. The electron transport layer has the thickness of about 50 nm, and is composed of a quinolinol aluminum complex ($Alq_3$) film in which dye doped is mixed.

The cathode 7 is for injecting an electron into the organic light emitting layer 6. The cathode 7 is substantially formed in the shape of the square, according to plane view. The central part of the cathode 7 is electrically connected on the organic light emitting layer 6. The cathode 7 is formed in surface shape so as to cover the approximately whole surface of the top surface of the organic light emitting layer 6. Each vertex of the cathode 7 is formed in the state where it is electrically connected on the connecting unit 15 of the second transmissible electrode 4. The cathode 7 is composed of an Al film having the thickness of about 100 nm. The resistivity of the Al film is the order of $10^{-6}$ Ω·cm. That is, the resistivity of the Al film which composes the cathode 7 is lower by double digits than the resistivity of ITO which composes the anode 11. Accordingly, it is proves that the resistance of anode 11 is larger than that of cathode 7. In addition, the anode 11, the organic light emitting layer 6, and the cathode 7 are equivalent to the light emitting unit.

The sealing plate 9 is for sealing the region in which the organic light emitting layer 6 is formed. The sealing plate 9 is sealed on the first transmissible electrode 3 and the second transmissible electrode 4 by a sealing material 8 composed of UV curing resin.

Next, operation of the organic EL device 1 according to the first embodiment mentioned above will be explained.

First of all, the hole is injected into the anode terminal 12 of the organic EL device 1 from the external power supply. Also, the electron is injected into the cathode terminal 16 of the organic EL device 1 from the external power supply. The hole injected from the anode terminal 12 is injected into the organic light emitting layer 6 through the anode 11. On the other hand, the electron injected from the cathode terminal 16 is injected into the organic light emitting layer 6 through the connecting unit 15 and the cathode 7. The hole and electron injected into the organic light emitting layer 6 are recombined and then emit the light. The light emitted transmits the anode 11 and the substrate 2, and is irradiated from light extraction surface 2b to external.

Next, a fabrication method for the organic EL device 1 accoring to the first embodiment mentioned above will be explained. FIG. 6 to FIG. 15 are diagrams for explaining each fabricating process of the organic EL device according to the first embodiment. FIGS. 6, 10, 12, and 14 are cross-sectional diagrams showing the same position as taken in the line III-III of FIG. 1, in each fabricating process of the organic EL device according to the first embodiment. FIGS. 7 and 8 are cross-sectional diagrams of the same position as taken in the line IV-IV of FIG. 1, in each fabricating process of the organic EL device according to the first embodiment. FIGS. 9, 11, 13, and 15 are top views in each fabricating process of the organic. EL device according to the first embodiment.

Figure 6:
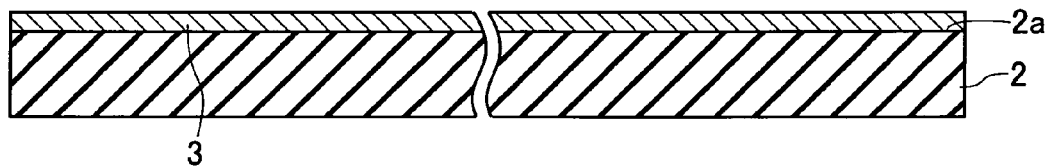
[FIG. 6] A cross-sectional diagram of the same position as the line III-III of FIG. 1 in each fabricating process for the organic EL device according to the first embodiment
Figure 7:
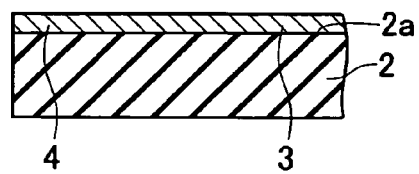
[FIG. 7] A cross-sectional diagram of the same position as the line IV-IV of FIG. 1 in each fabricating process for the organic EL device according to the first embodiment
Figure 8:
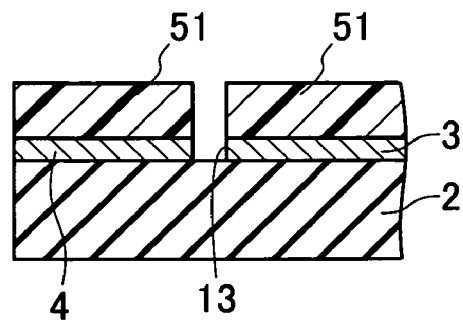
[FIG. 8] A cross-sectional diagram of the same position as the line IV-IV of FIG. 1 in each fabricating process for the organic EL device according to the first embodiment

First of all, as shown in FIG. 6 and FIG. 7, the first transmissible electrode 3 and the second transmissible electrode 4 composed of ITO are formed by a sputtering technique, on all over the growth principal surface 2a of the substrate 2.

Figure 9:
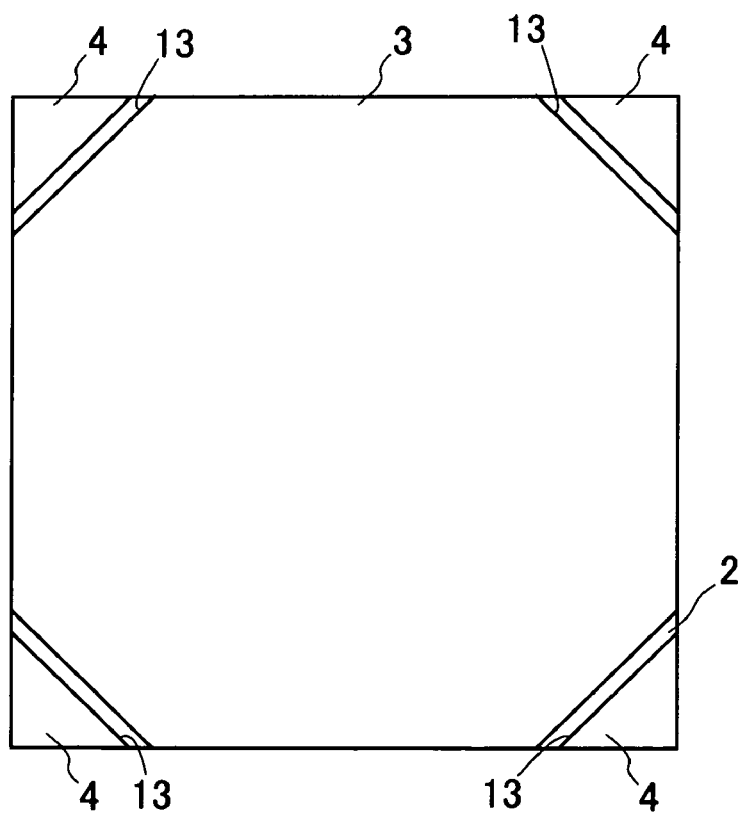
[FIG. 9] A top view in each fabricating process for the organic EL device according to the first embodiment

Next, as shown in FIG. 8, a resist layer 51 is formed on the top surface of the transmissible electrodes 3 and 4 by a photolithographic method so that the region which forms the insulating trench 13 may be exposed. Then, the insulating trench 13 is formed between the first transmissible electrode 3 and the second transmissible electrode 4 by an etching method. Then, as shown in FIG. 9, the resist layer 51 is removed. Accordingly, the transmissible electrodes 3 and 4 patterned on the growth principal surface 2a of the substrate 2 are completed.

Figure 10:
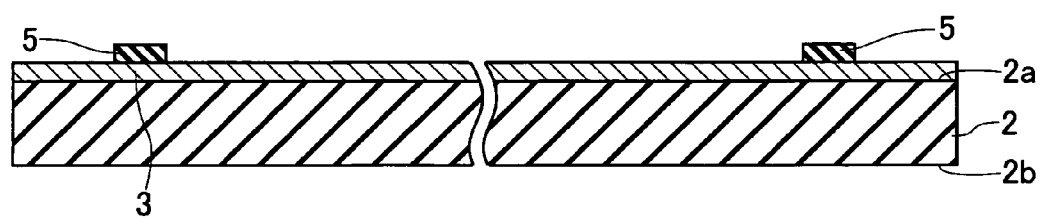
[FIG. 10] A cross-sectional diagram of the same position as the line III-III of FIG. 1 in each fabricating process for the organic EL device according to the first embodiment
Figure 11:
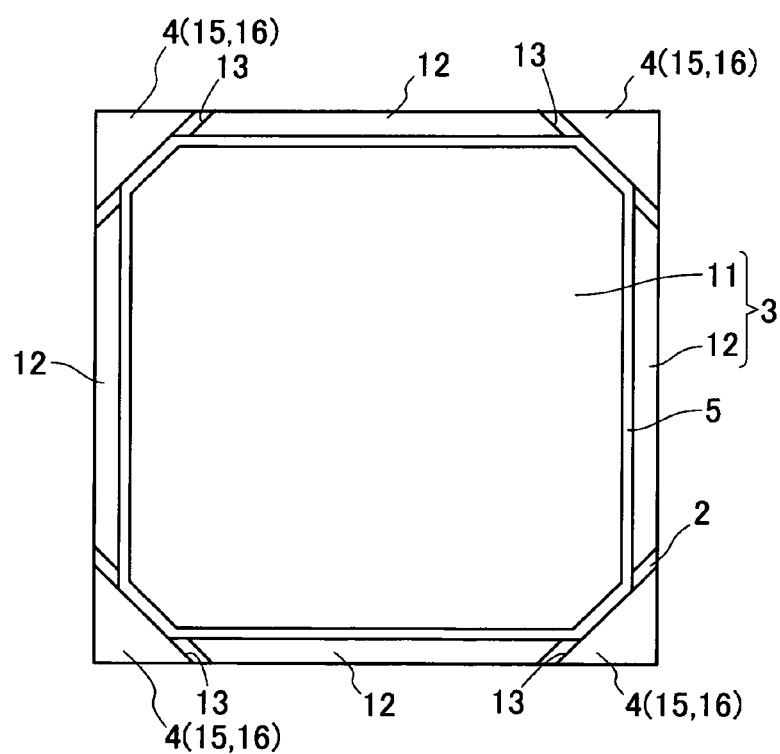
[FIG. 11] A top view in each fabricating process for the organic EL device according to the first embodiment

Next, as shown in FIG. 10 and FIG. 11, the insulating layer 5 composed of $SiO_2$ patterned is formed on the anode 11 and in the insulating trench 13 by the sputtering technique, the photolithographic method, and the etching method.

Figure 12:
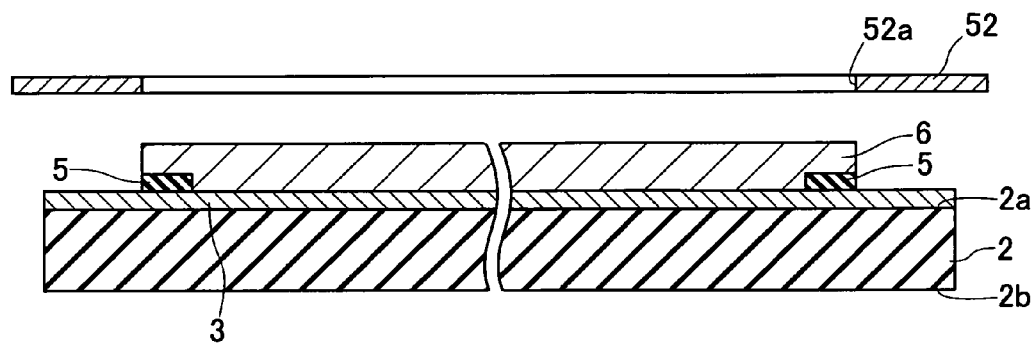
[FIG. 12] A cross-sectional diagram of the same position as the line III-III of FIG. 1 in each fabricating process for the organic EL device according to the first embodiment
Figure 13:
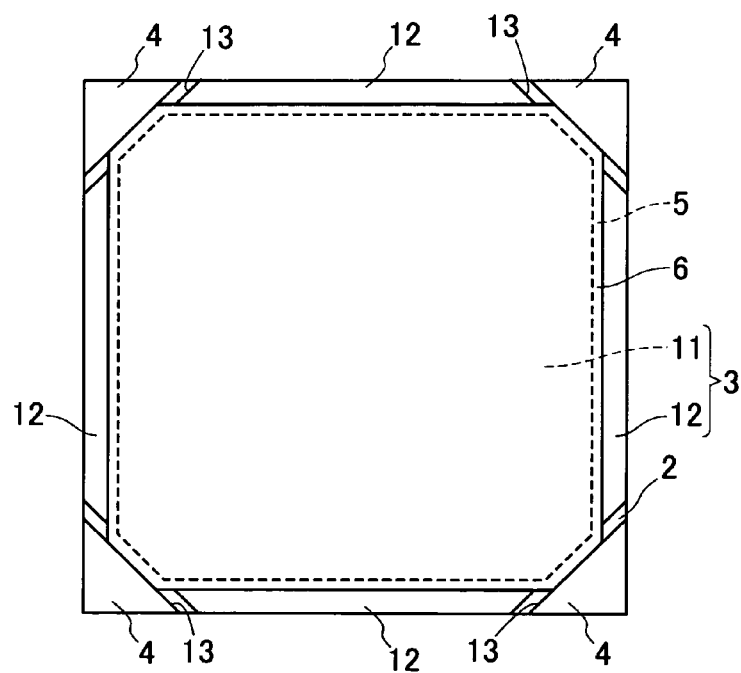
[FIG. 13] A top view in each fabricating process for the organic EL device according to the first embodiment

Next, as shown in FIG. 12, the octagonal-shaped organic light emitting layer 6 shown in FIG. 12 and FIG. 13 is vapor-deposited on the anode 11 by using a shadow mask 52 in which an apertural area 52a is formed in the central part.

Figure 14:
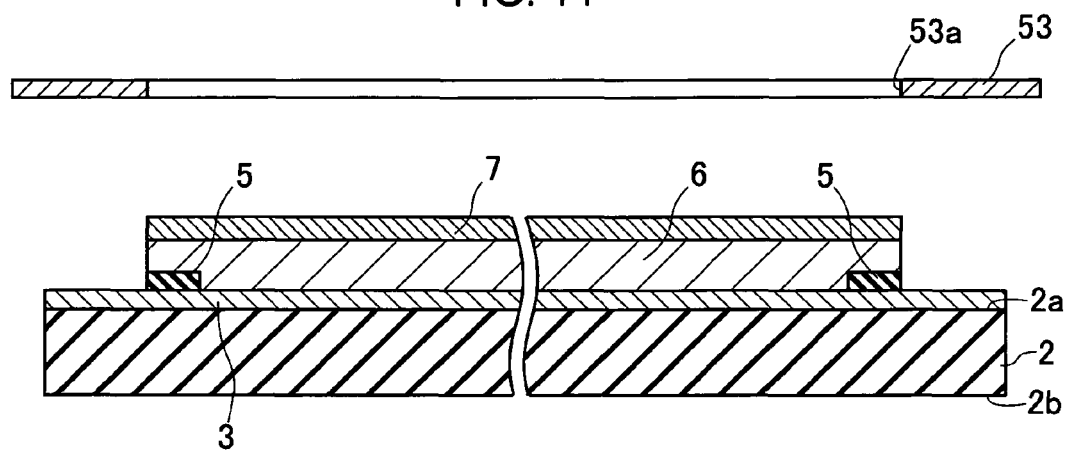
[FIG. 14] A cross-sectional diagram of the same position as the line III-III of FIG. 1 in each fabricating process for the organic EL device according to the first embodiment
Figure 15:
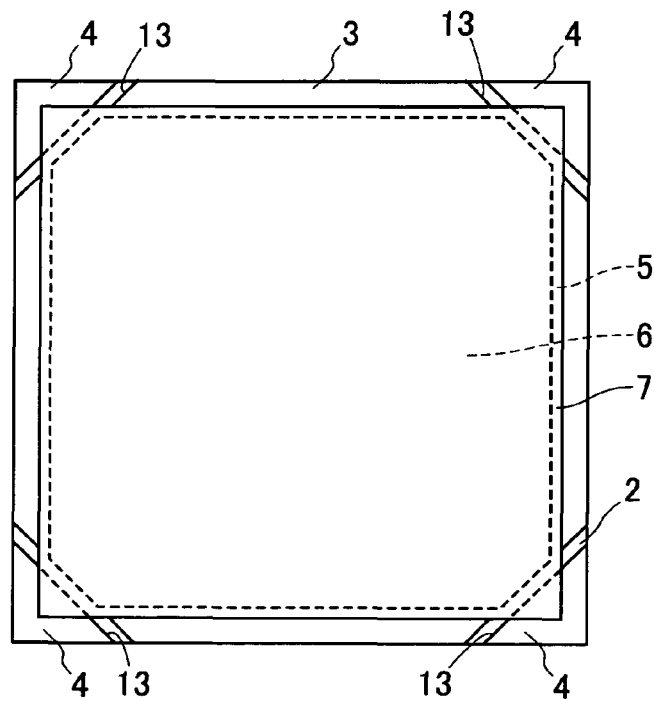
[FIG. 15] A top view in each fabricating process for the organic EL device according to the first embodiment

Next, the cathode 7 of the shape of approximately square composed of Al films is vapor-deposited on the organic light emitting layer 6 and the second transmissible electrode 4, as shown in FIG. 14 and FIG. 15, by using the shadow mask 53 in which the apertural area 53a is formed in the central part as shown in FIG. 14.

Next, as shown in FIG. 1 and FIG. 3, the organic EL device 1 is completed by sealing the sealing plate 9 via the sealing material 8.

As mentioned above, the organic EL device 1 forms so that the size S1 of the anode connecting surface 12a of the anode terminal 12 of surface shape may become larger than the size S2 of the cathode connecting surface 16a of the cathode terminal 16. Accordingly, since more holes can be injected into the anode terminal 12, more holes can be made to reach to the central part of the anode 11 composed of ITO having large resistance. Accordingly, since many holes are injected also into the central part of the organic light emitting layer 6, the recombination of the hole and the electron can be improved. As a result, since the luminance in the central part can be improved, the mottle of luminance distribution can be reduced.

Moreover, in the organic EL device 1, the anode terminal 12 is formed along with each side of the growth principal surface 2a, and the cathode terminal 16 is formed near each vertex of the growth principal surface 2a. Accordingly, the distance between the anode terminal 12 and the center C of the organic light emitting layer 6 can be set to lower than the distance between the cathode terminal 16 and the center C of the organic light emitting layer 6. As a result, since the electric resistance to the center of the anode terminal 12 and the anode 11 can be set to low, the hole reached to the center of the anode 11 can be applied more. As a result, since the luminance in the center C of the organic light emitting layer 6 can be improved, the mottle of luminance distribution can be more reduced.

Moreover, in the organic EL device 1, the anode terminal 12 and the cathode terminal 16 are formed in the surroundings of the center C of the organic light emitting layer 6 at point symmetry. Accordingly, since the hole and the electron are equally injected from each terminal 12 and 16 to the central of the organic light emitting layer 6, the mottle of luminance distribution can be more reduced.

Since the organic EL device 1 is formed so that the almost all region of both sides of the organic light emitting layer 6 may be covered with the anode terminal 12 of surface shape and the cathode terminal 16 of surface shape, it can be made to emit the light in the almost all region of the organic light emitting layer 6. Accordingly, the mottle of luminance distribution can be more reduced.

Moreover, the anode 11 and the anode terminal 12 are composed of the integrally same material (ITO) on the growth principal surface 2a, in the organic EL device 1. Also, the first transmissible electrode 3 and the second transmissible electrode 4 are composed of the same material (ITO), in the organic EL device 1. Accordingly, since the first transmissible electrode 3 and the second transmissible electrode 4 can be formed at the same time by patterning, the fabricating process can be simplified.

Here, an experiment for proving the effect of the organic EL device 1 according to the first embodiment will be explained. The experiment examined the luminance distribution from the luminance of each point by measuring the luminance of five places on the light extraction surface 2b. One of five places which measured the luminance is the center of the light extraction surface 2b (the center C of the organic light emitting layer 6). The remaining four place P (refer to FIG. 5) is on four perpendiculars from the center of light extraction surface 2b to each side. Furthermore, four places P on the perpendicular are all the distance from the center being the same parts, and are near each side of the light extraction surface 2b. Whole surface average luminance was set to 2200 cd/m$^2$.

Here, the luminance distribution [%] is based on the following formula:

Luminance distribution [%]=100×(standard deviation of luminance)/(average of luminance).

In addition, the luminance is measured 3 times in each measuring point.

Moreover, in order to compare with the organic EL device 1 according to the first embodiment, the organic EL device for a comparison (hereinafter, referred to as comparative example) was produced. The substrate of the same size and shape is used for the comparative example. Then, the anode terminal was formed along with opposed two sides, and the cathode terminal was formed along with other two opposed sides. The comparative example has the similar configuration as the first embodiment except the external terminal.

In the experiment, the luminance distribution of the comparative example was about 35%. On the other hand, in the organic EL device according to the first embodiment, the luminance distribution was able to be reduced to about 14%. Accordingly, in the organic EL device according to the first embodiment, it proves that the reduction of the luminance of the central part can be suppressed against the peripheral part of the light emitting region. Furthermore, in the organic EL device according to the first embodiment, it proves that the hole injected into the central part can be increased.

(Second Embodiment)

Figure 16:
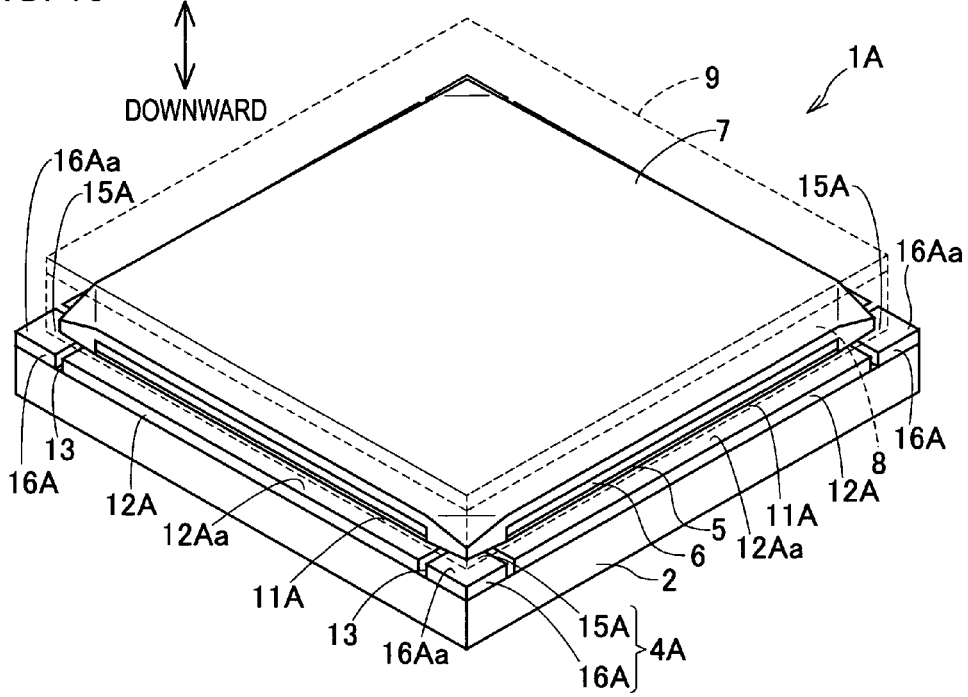
[FIG. 16] A whole perspective diagram showing an organic EL device according to a second embodiment
Figure 17:
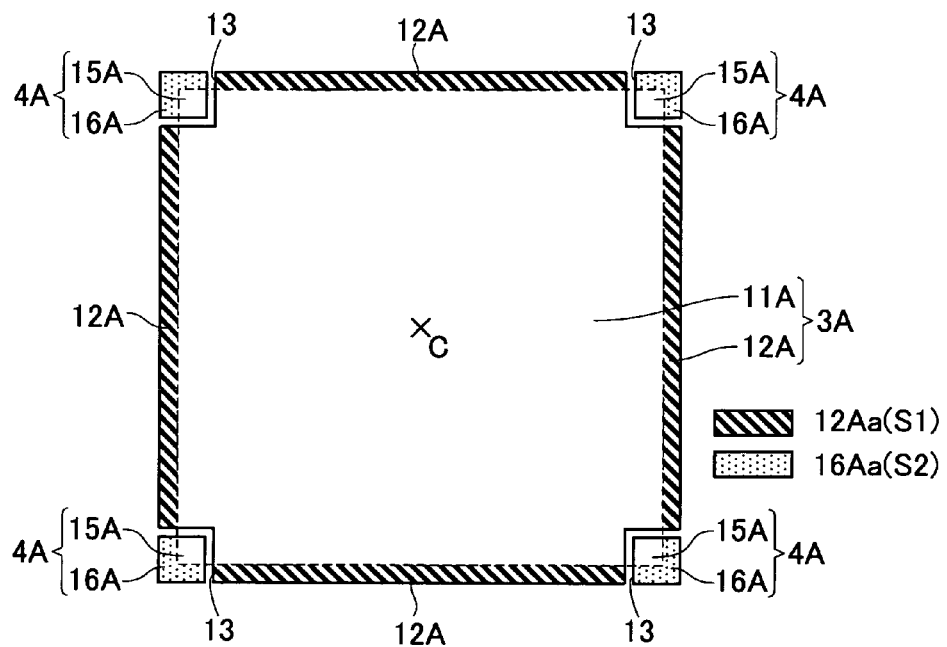
[FIG. 17] A top view showing a transmissible electrode

Next, an organic EL device according to a second embodiment that modified a part of the first embodiment mentioned above will be explained, with reference to drawings. FIG. 16 is a whole perspective diagram showing the organic EL device accroding to the second embodiment. FIG. 17 is a top view showing a transmissible electrode. In FIG. 16, dashed lines show a sealing material 8 and a sealing plate 9 for convenience. Also, in FIG. 17, dashed lines show the periphery of the sealing material 8. The same configuration as the first embodiment attaches the same reference numeral, and therefore omits the explanation.

As shown in FIG. 16 and FIG. 17, in the organic EL device 1A according to the second embodiment, the shape of the first transmissible electrode 3A and the second transmissible electrode formed on the substrate 2 4A is different from that of the first embodiment.

The first transmissible electrode 3A is formed in the cross shape in regions except near the vertex of the growth principal surface 2a (refer to FIG. 3) of the substrate 2. The first transmissible electrode 3A includes an anode 11A inside of the sealing material 8, and an anode terminal 12A outside of the sealing material 8.

The second transmissible electrode 4A is formed in a square shape near each vertex of the growth principal surface 2a of the substrate 2. The insulating trench 13 for insulating each other is formed between the second transmissible electrode 4A and the first transmissible electrode 3A. The second transmissible electrode 4A includes a connecting unit 15A inside of the sealing material 8 and a cathode terminal 16A outside of the sealing material 8.

Here, as clearly from FIG. 17, the size S1 of anode connecting surface 12Aa of the anode terminal 12A is larger than the size S2 of cathode connecting surface 16Aa of the cathode terminal 16A. Moreover, the anode terminal 12A is formed along with each side of the substrate 2. On the other hand, the cathode terminal 16A is formed near each vertex of the growth principal surface 2a of the substrate 2. Furthermore, the terminals 12A and 16A are formed in the surroundings of the center C of the organic light emitting layer 6 at point symmetry. As a result, the organic EL device 1A according to the second embodiment can achieve the similar effect as the organic EL device 1 according to the first embodiment.

(Third Embodiment)

Figure 18:
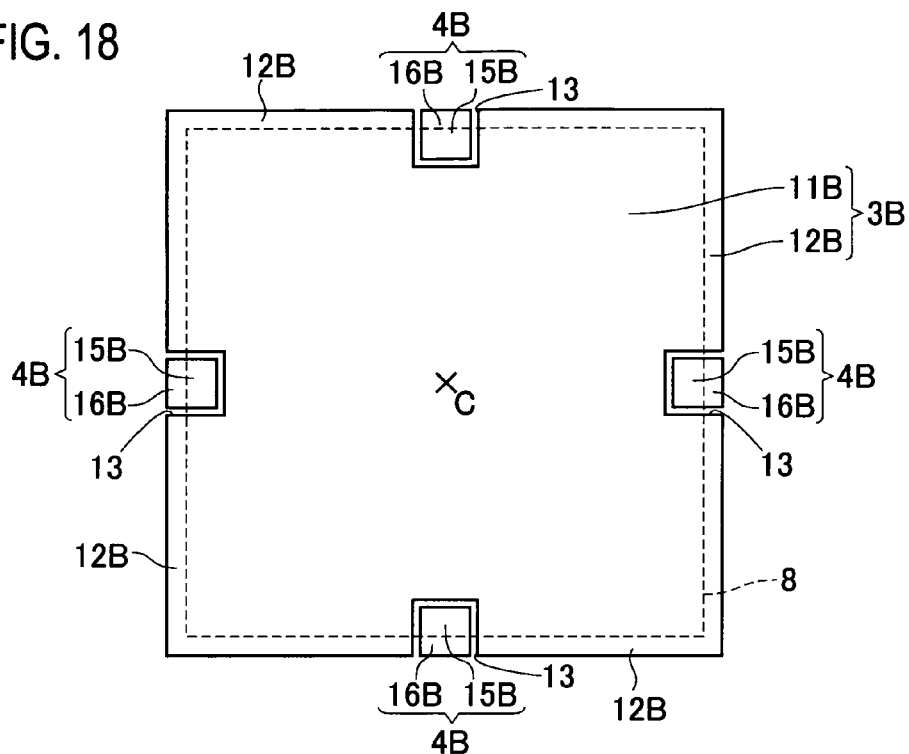
[FIG. 18] A top view showing a transmissible electrode according to a third embodiment

Next, an organic EL device according to a third embodiment that modified a part of the first embodiment mentioned above will be explained, with reference to drawings. FIG. 18 is a top view of a transmissible electrode according to the third embodiment. In FIG. 18, dashed lines show the periphery of the sealing material 8. In addition, the same configuration as the embodiment mentioned above attaches the same reference numeral, and therefore omits the explanation.

As shown in FIG. 18, in the organic EL device according to the third embodiment, the shapes of the first transmissible electrode 3B formed on the growth principal surface 2a of the substrate 2 (refer to FIG. 3) and the second transmissible electrodes 4B are different from the first embodiment.

The first transmissible electrode 3B is formed in the approximately whole surface of the growth principal surface 2a except that the central part of each side of the growth principal surface 2a of the substrate 2 is removed in the square shape. The first transmissible electrode 3B includes an anode 11B inside of the sealing material 8, and an anode terminals 12B outside of the sealing material 8.

The second transmissible electrodes 4B are formed in the central part of each side of the growth principal surface 2a of the substrate 2 in the square shape. The insulating trenches 13 for insulating each other are formed between the second transmissible electrodes 4B and the first transmissible electrode 3B. The second transmissible electrodes 4B include the connecting unit 15B inside of the sealing material 8 and the sealing material 8 outside of the cathode terminal 16B, respectively.

Here, as clearly from FIG. 18, the anode connecting surface 12Ba of the anode terminal 12B is larger than the cathode connecting surface 16Ba of the cathode terminal 16B. Also, the terminals 12B and 16B are formed in the surroundings of the center C of the organic light emitting layer 6, at point symmetry. Accordingly, the organic EL device according to the third embodiment can reduce the mottle of luminance distribution.

(Fourth Embodiment)

Figure 19:
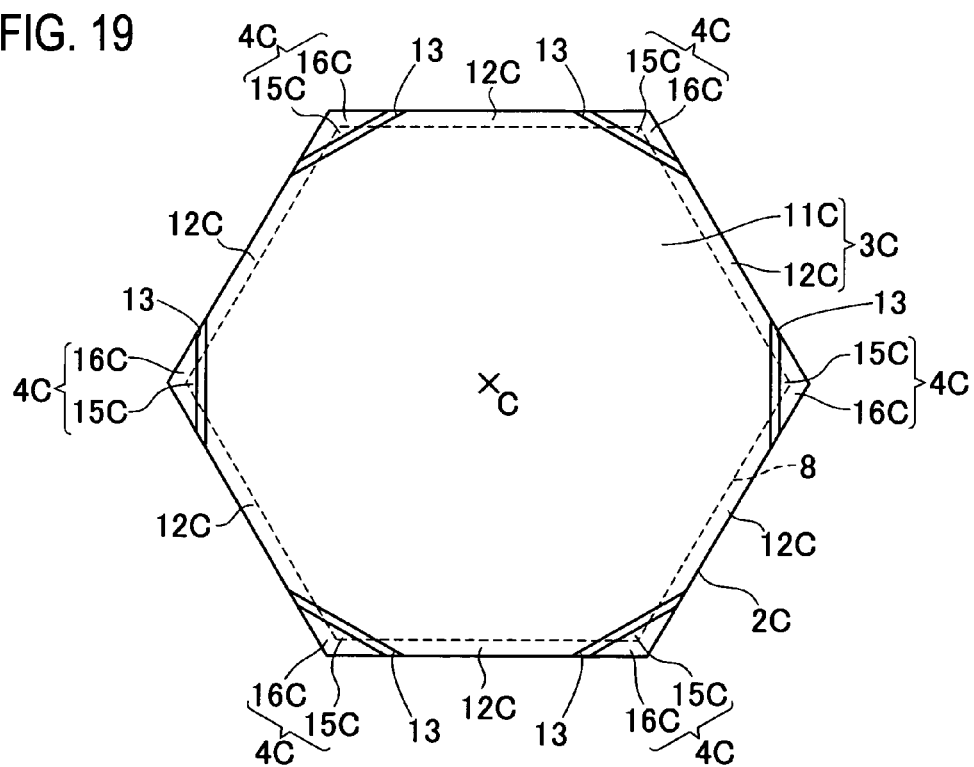
[FIG. 19] A top view of a substrate and a transmissible electrode according to a fourth embodiment

Next, an organic EL device according to a fourth embodiment that modified a part of the first embodiment mentioned above will be explained, with reference to drawings. FIG. 19 is a top view showing a substrate and a transmissible electrode according to the fourth embodiment. In FIG. 19, dashed lines show the periphery of the sealing material 8. In addition, the same configuration as the embodiment mentioned above attaches the same reference numeral, and therefore omits the explanation.

As shown in FIG. 19, a substrate 2C is formed in regular hexagon shape, in the organic EL device according to the fourth embodiment. In connection with this, in the organic EL device according to the fourth embodiment, the shapes of the first transmissible electrode 3C and the second transmissible electrode 4C formed on the substrate 2C is different from that of the first embodiment.

The first transmissible electrode 3C is formed in regions except near the vertex of the substrate 2C in a dodecagon shape. The first transmissible electrode 3C includes an anode 11C inside of the sealing material 8, and an anode terminal 12C outside of the sealing material 8.

The second transmissible electrode 4C is formed in triangular shape near each vertex of the substrate 2C. The insulating trench 13 for insulating each other electrically is formed between the second transmissible electrode 4C and the first transmissible electrode 3C. The second transmissible electrode 4C includes a connecting unit 15C inside of the sealing material 8, and a cathode terminal 16C outside of the sealing material 8.

Here, as clearly from FIG. 19, an anode connecting surface 12Ca of the anode terminal 12C is larger than a cathode connecting surface 16Ca of the cathode terminal 16C. Moreover, the anode terminal 12C is formed along with each side of the top surface of the substrate 2C (growth principal surface). On the other hand, the cathode terminal 16C is formed near each vertex of the top surface of the substrate 2C. Furthermore, the terminals 12C and 16C are formed in the surroundings of the center C of the organic light emitting layer 6, at point symmetry. As a result, the organic EL device according to the fourth embodiment can achieve the similar effect as the organic EL device 1 according to the first embodiment.

(Fifth Embodiment)

Figure 20:
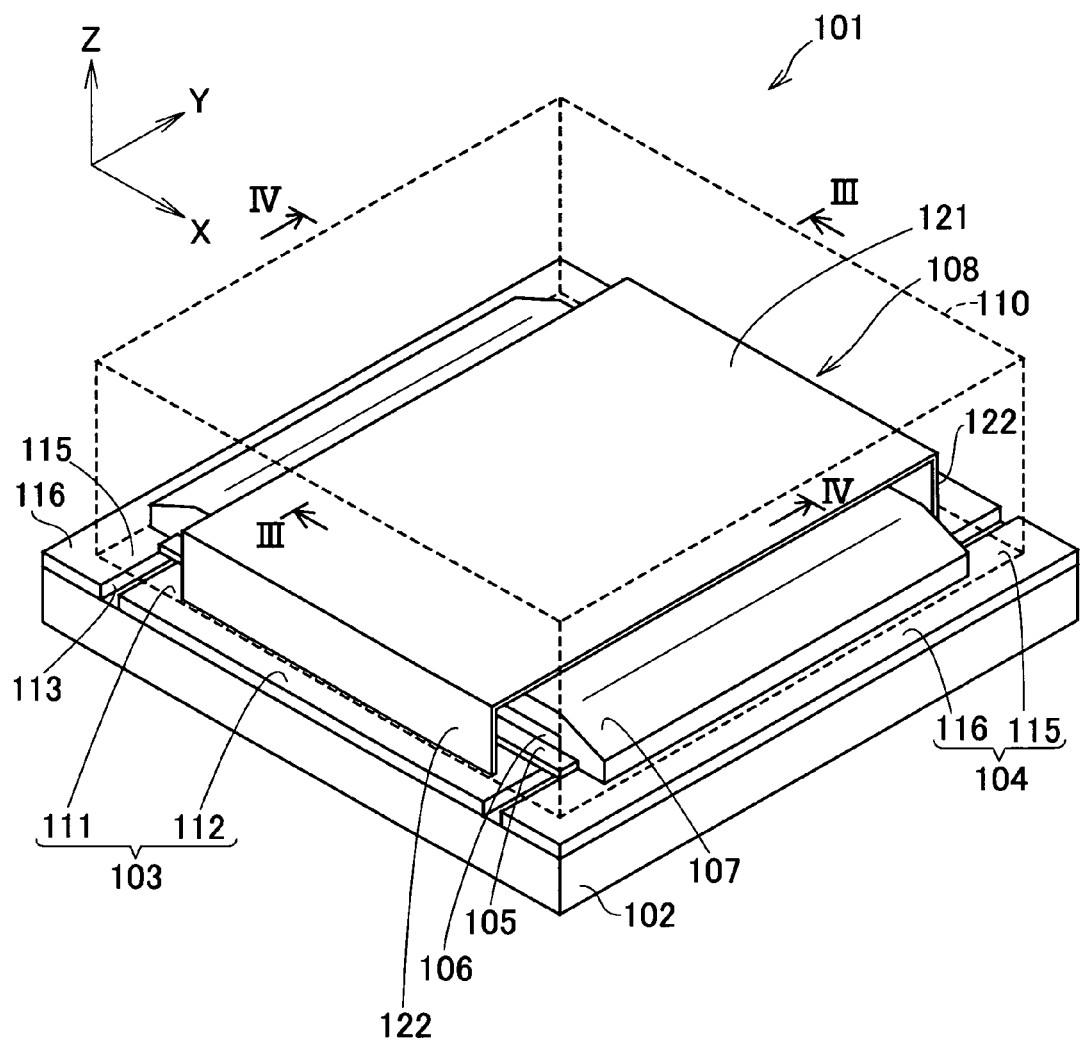
[FIG. 20] A whole perspective diagram showing an organic EL device according to a fifth embodiment
Figure 21:
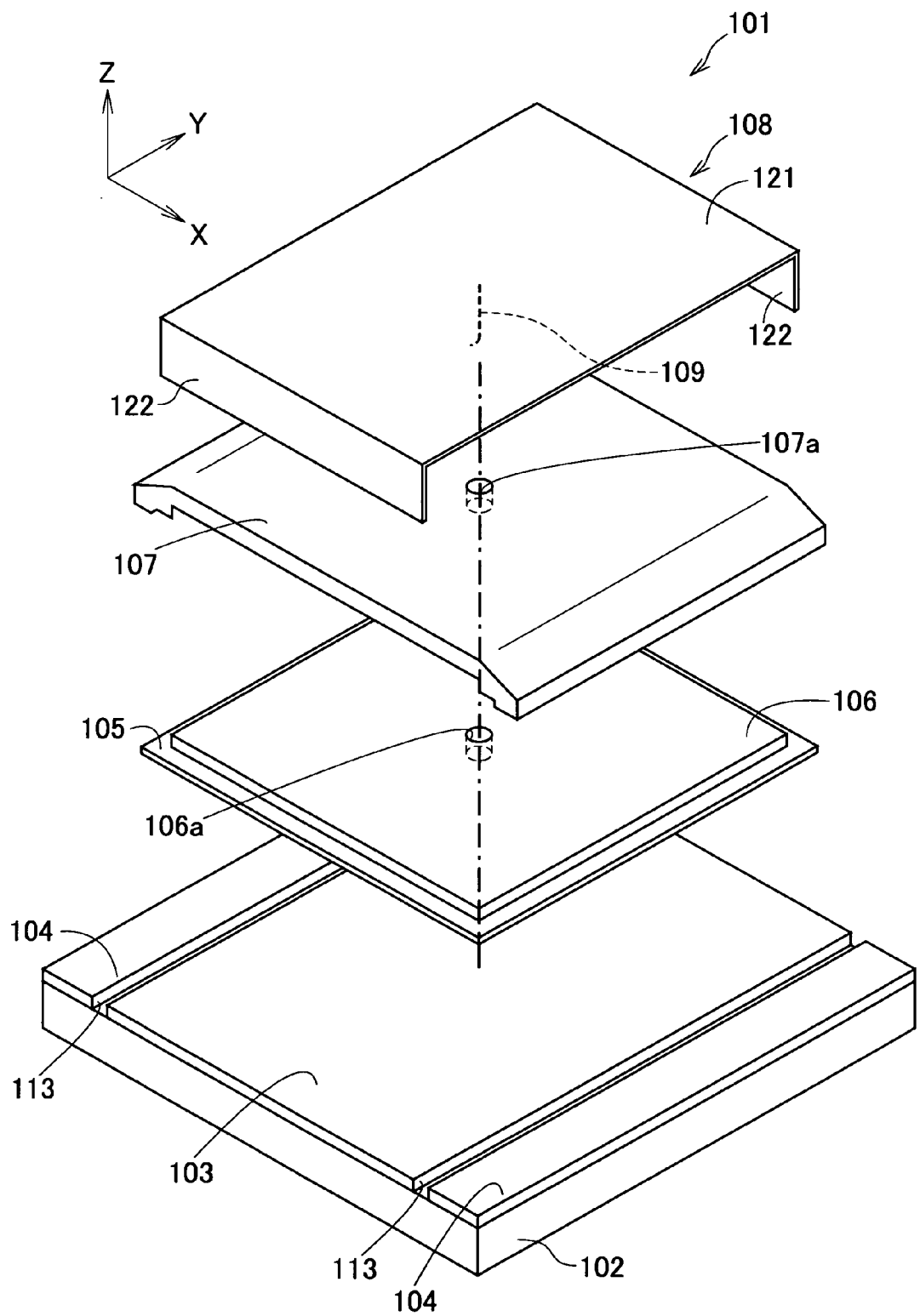
[FIG. 21] An exploded perspective diagram shown an organic EL device
Figure 22:
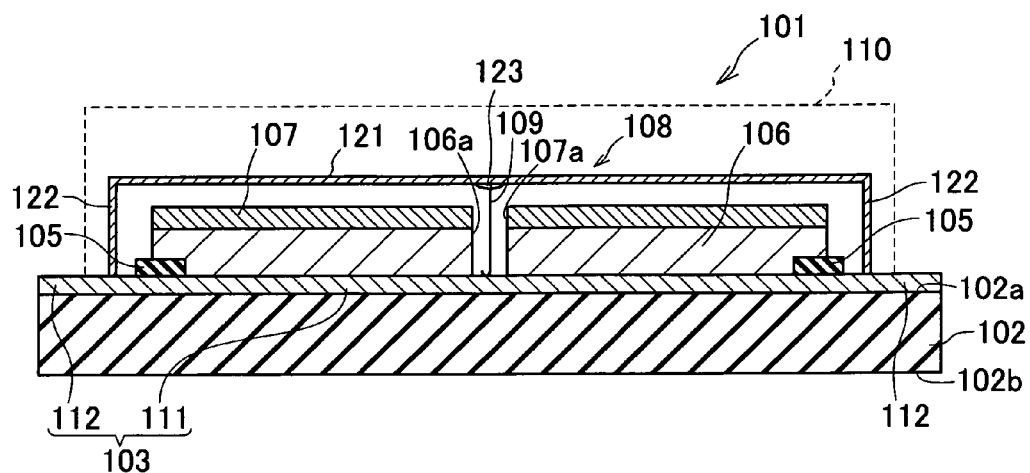
[FIG. 22] A cross-sectional diagram taken in line III-III of FIG. 20
Figure 23:
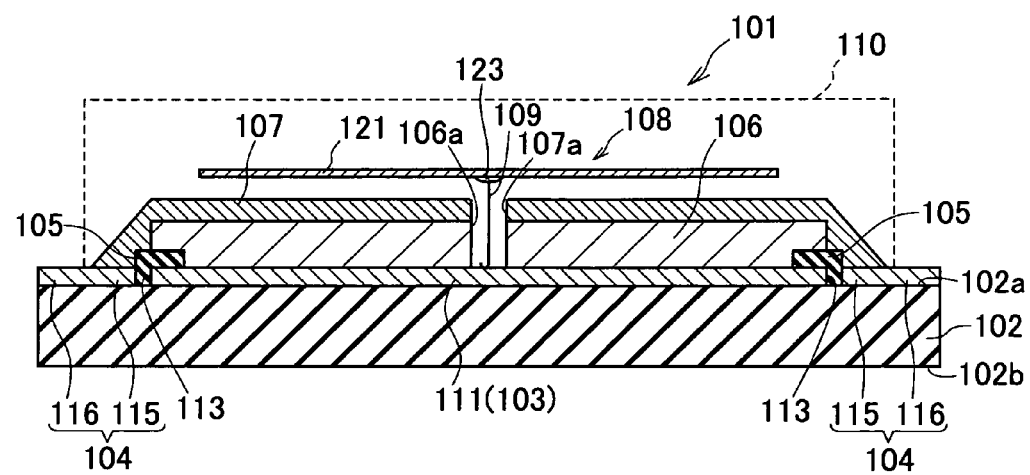
[FIG. 23] A cross-sectional diagram taken in line IV-IV of FIG. 20

Hereinafter, a bottom emission type organic EL device according to a fifth embodiment of the present invention will be explained, with reference to drawings. FIG. 20 is a whole perspective diagram showing the organic EL device according to the fifth embodiment. FIG. 21 is an exploded perspective diagram showing the organic EL device. FIG. 22 is a cross-sectional diagram taken in line III-III of FIG. 20. FIG. 23 is a cross-sectional diagram taken in line IV-IV of FIG. 20. In addition, XYZ shown in the arrow of FIG. 20 is applied into the XYZ direction. Moreover, +Z direction is applied into upward, and −Z direction is applied downward.

As shown in FIG. 20 to FIG. 23, the organic EL device 101 according to the fifth embodiment includes: a substrate 102; a first transmissible electrode (first electrode) 103; a second two transmissible electrodes 104; an insulating layer 105; an organic luminous layer 106; a cathode (second electrode) 107; a feed unit member 108; a convex connecting member 109; and a sealing member 110. In each diagram, dashed lines show the sealing member 110 for convenience.

The substrate 102 is composed of a glass substrate which can transmit the light. The substrate 102 has a thickness of about 0.7 mm. The substrate 102 is formed in the shape of a square whose one side is about 15 cm, according to plane view. The top surface of the substrate 102 is the growth principal surface 102a in which each layers 103-107 are formed. The bottom surface of the substrate 102 is the light extraction surface 102b where the light is extracted.

The first transmissible electrode 103 is for injecting a hole into the organic luminous layer 106. The first transmissible electrode 103 is formed in the growth principal surface 102a of the region except for both the ends of the direction of X. That is, the first transmissible electrode 103 is formed in rectangular shape with small width of the direction of X rather than the growth principal surface 102a. The first transmissible electrode 103 is composed of indium tin oxide (ITO) having the thickness of about 150 nm which can transmit the light. The resistivity of ITO is the order of $10^{-4}$ Ω·cm.

The first transmissible electrode 103 includes the anode 111 and the anode terminal 112.

The anode 111 is electrically connected with the bottom surface of the organic luminous layer 106. The anode 111 is formed in surface shape so that the approximately whole surface of the bottom surface of the organic luminous layer 106 may be covered. The anode 111 is formed in the inside of the sealing member 110.

The anode terminal 112 is for connecting an external power supply (not shown) and the anode 111. The anode terminal 112 is integrally formed with the anode 111. The anode terminal 112 is formed along with each side at the side of the direction Y of the growth principal surface 102a of the substrate 102. The anode terminal 112 is formed in the outside of the sealing member 110. A soldering layer (not shown) for maintaining the whole surface at equivalent potential is formed on the approximately whole surface of the top surface of the anode terminal 112.

The second transmissible electrode 104 is for connecting the external power supply and the cathode 107. As shown in FIG. 21, the second transmissible electrode 104 is formed near each side at the side of the direction X of the growth principal surface 102a of the substrate 102. The second transmissible electrode 104 is formed in rectangular shape so as to extend in the direction Y. The second transmissible electrode 104 is composed of ITO having the thickness of about 150 nm which can transmit the light. The insulating trench 113 for insulating each other electrically is formed between the second two transmissible electrodes 104 and the first transmissible electrode 103.

The second transmissible electrode 104 includes a connecting unit 115 and a cathode terminal 116.

The connecting unit 115 is formed in the inside of the sealing member 110. The both ends at the side of the direction X of the cathode 107 are electrically connected to the connecting unit 115.

The cathode terminal 116 is formed along with the side at the side of the direction X of the growth principal surface 102a of the substrate 102. The cathode terminal 116 is formed in the outside of the sealing member 110. A soldering layer (not shown) for maintaining the whole surface at equivalent potential is formed in the approximately whole surface of the top surface of the cathode terminal 116.

The insulating layer 105 is for suppressing a short circuit between the anode 111 and the cathode 107. The insulating layer 105 is formed in square shape. The central part of the insulating layer 105 is opened in order to expose the anode 111. A part of insulating layer 105 is formed in the insulating trench 113. The insulating layer 105 is composed of $SiO_2$.

The organic luminous layer 106 is for emitting the light. The organic light emitting layer 106 is formed in the rectangular shape in which a periphery is smaller than the periphery of the insulating layer 105, according to plane view. The circular apertural area (emitting layer apertural area) 106a for exposing the anode 111 is formed in the central part of the organic light emitting layer 106. The apertural area 106a is preferable to be formed in a first diameter (for example, about 100 μm). The organic luminous layer 106 is formed in the state where it is electrically connected on the anode 111. The hole transport layer and the electron transport layer are laminated sequentially from the anode 111 side in the organic luminous layer 106. The hole transport layer is composed of a diphenylnaphthyldiamine (NPD) film having the thickness of about 50 nm. The electron transport layer has the thickness of about 50 nm, and is composed of a quinolinol aluminum complex (Alq3) film in which the dye doped is made to mix.

The cathode 107 is for injecting an electron into the organic luminous layer 106. The cathode 107 is formed in substantially rectangular shape, according to plane view. The central part of the cathode 107 is electrically connected to the top surface of the organic light emitting layer 106. The cathode 107 is formed in the surface shape so as to cover the approximately whole surface of the top surface of the organic luminous layer 106. The convex connecting member 109 is made to insert into the central part of the cathode 107, and threreby the circular apertural area (electrode apertural area) 107a for insulating mutually is formed. The apertural area 107a is preferable to be formed in a first diameter (for example, about 100 μm). The apertural area 107a is formed in the position corresponding to the center of the organic light emitting layer 106. The apertural area 106a of the organic light emitting layer 106 and the apertural area 107a of the cathode 107 are formed in the same shape as the same position, according to plane view.

The edge part at the side of the direction X of the cathode 107 is electrically connected to the connecting unit 115 of the second transmissible electrode 104. The cathode 107 is composed of an Al film having the thickness of about 100 nm. The resistivity of the Al film is the order of $10^{-6}$ Ω·cm. That is, the resistivity of the Al film which composes the cathode 107 is lower by double digits than the resistivity of ITO which composes the anode 111. Accordingly, it is proves that the resistance of anode 111 is larger than that of cathode 107.

The feed unit member 108 is for feeding the electric power to the central part in the hole injected into the first transmissible electrode 103. The feed unit member 108 is composed of a tabular member of Al having lower electric resistance. The feed unit member 108 includes a top plate part 121 and a pair of leg part 122.

The top plate part 121 is formed in the rectangular planar. The top plate part 121 is formed between the leg part 122 and the leg part 122. The top plate part 121 is disposed the upper side of the cathode 107. That is, the top plate part 121 is formed in the opposite side of the first transmissible electrode 103 sandwiching the organic light emitting layer 106. In order to insulate the top plate part 121 and the cathode 107, the predetermined gap is formed between the top plate part 121 and the cathode 107.

The pair of leg part 122 is formed in the both ends of the direction Y of the top plate part 121. The leg parts 122 are formed so as to curve 90 degrees against the top plate part 121. The leg part 122 is formed so as to extend in -Z direction against the top plate part 121. The bottom surface of the leg part 122 is a region outside the organic light emitting layer 106, and is connected to the first transmissible electrode 103 by jointing materials, such as solder. In addition, the jointing material functions also as a spacer for adjusting the gap between the top plate part 121 and the first transmissible electrode 103.

The convex connecting member 109 is for electrically connecting the central part of the first transmissible electrode 103 and the feed unit member 108. The convex connecting member 109 is composed of an Al wire in which elastic deformation is possible. The edge part of the convex connecting member 109 contacts and electrically connects to the first transmissible electrode 103. In addition, the edge part of the convex connecting member 109 is pressed to be flexible by the first transmissible electrode 103. The convex connecting member 109 is bonded to the center of the top plate part 121 by using the conductive jointing material 123, such as solder. The convex connecting member 109 is inserted into the apertural areas 107a and 106a. Accordingly, a predetermined gap is formed between the convex connecting member 109 and the cathodes 107, and the convex connecting member 109 is insulated with the cathode 107.

The sealing member 110 is for sealing the region in which the organic light emitting layer 106 is formed. The sealing member 110 includes a sealing plate which composes a top plate, and a sealing material which is composed of UV curing resin for sealing the sealing plate.

Next, an operation of the organic EL device 101 according to the fifth embodiment mentioned above will be explained.

First of all, the hole is injected into the anode terminal 112 of the organic EL device 101 from the external power supply. Also, the electron is injected into the cathode terminal 116 of the organic EL device 101 from the external power supply. A part of hole injected from the anode terminal 112 is injected into the organic light emitting layer 106 via the anode 111. The remainder of the hole injected from the anode terminal 112 is fed into the central part of the anode 111 via the feed unit member 108 and the convex connecting member 109. Then, the hole is injected from the central part of the anode 111 into the central part of the organic light emitting layer 106. On the other hand, the electron injected from the cathode terminal 116 is injected into the organic luminous layer 106 via the connecting unit 115 and the cathode 107. The hole and electron injected into the organic luminous layer 106 are recombined and then emit the light. The emitted light transmits the anode 111 and the substrate 102, and is irradiated from the light extraction surface 102b to external.

Next, a fabrication method of the organic EL device 101 according to the fifth embodiment mentioned above will be explained. FIG. 24 to FIG. 30 are diagrams for explaining each fabricating process of the organic EL device according to the fifth embodiment. FIG. 24 to FIG. 29 are cross-sectional diagrams of the same position as taken in the line IV-IV of FIG. 20, in each fabricating process of the organic EL device according to the fifth embodiment. FIG. 30 is a cross-sectional diagram of the same position as taken in the line III-III of FIG. 20, in each fabricating process of the organic EL device according to the fifth embodiment.

Figure 24:
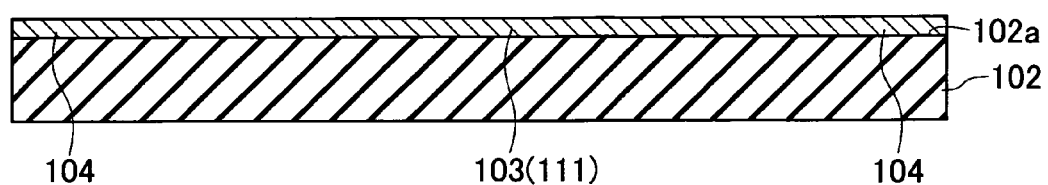
[FIG. 24] A diagram for explaining each fabricating process of an organic EL device according to a fifth embodiment

First of all, as shown in FIG. 24, the first transmissible electrode 103 and the second transmissible electrode 104 composed of ITO on all over the growth principal surface 102a of the substrate 102 are formed by the sputtering technique.

Figure 25:
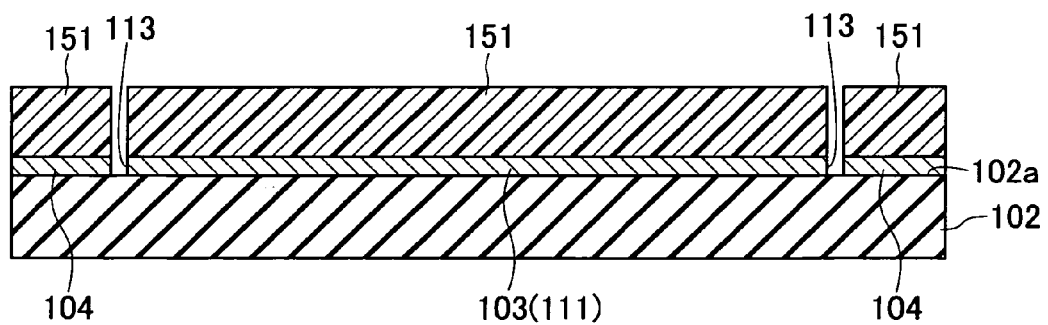
[FIG. 25] A diagram for explaining each fabricating process of the organic EL device according to the fifth embodiment

Next, as shown in FIG. 25, the resist layer 151 is formed on the top surface of the transmissible electrodes 103 and 104 by a photolithographic method so that the region which forms the insulating trench 113 may be exposed. Then, the insulating trench 113 is formed between the first transmissible electrode 103 and the second transmissible electrode 104 by an etching method. Then, the resist layer 151 is removed.

Accordingly, the transmissible electrodes 103 and 104 patterned on the growth principal surface 102a of the substrate 102 are completed.

Figure 26:
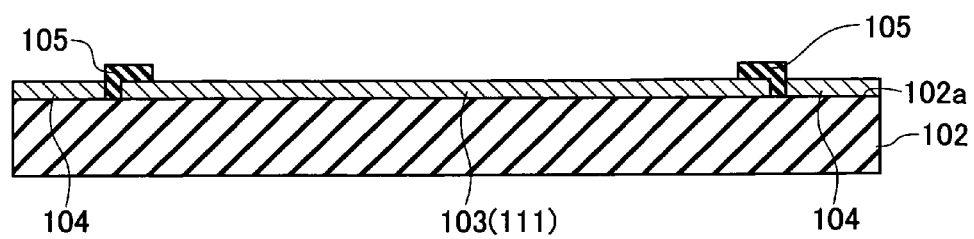
[FIG. 26] A diagram for explaining each fabricating process of the organic EL device according to the fifth embodiment

Next, as shown in FIG. 26, the patterned insulating layer 105 composed of SiO2 by using the sputtering technique, the photolithographic method, and the etching method is formed in the first transmissible electrode 103 and in the insulating trench 113.

Figure 27:
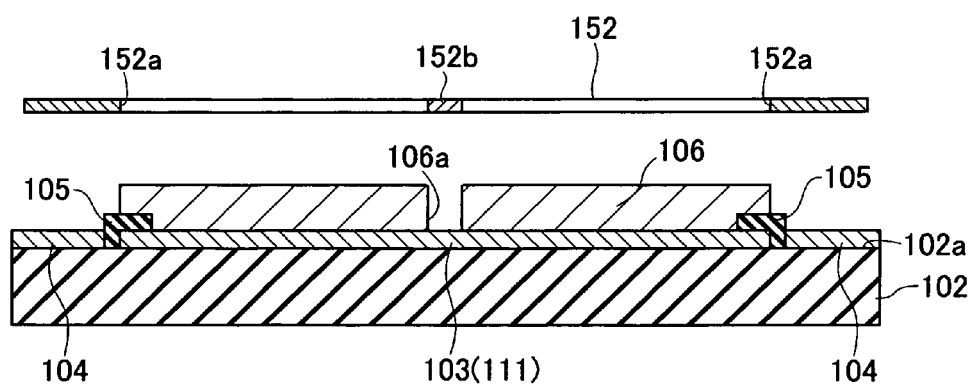
[FIG. 27] A diagram for explaining each fabricating process of the organic EL device according to the fifth embodiment

Next, as shown in FIG. 27, the organic light emitting layer 106 is vapor-deposited on the anode 111 by using the shadow mask 152. The apertural area 152a is formed in the central part of the shadow mask 152. Also, the shield part 152b for forming the apertural area 106a is formed in the central part of the shadow mask 152. In addition, when vapor-depositing the organic light emitting layer 106, it is carried out rotating the substrate 102 or the shadow mask 152. Accordingly, the organic light emitting layer 106 by which the apertural area 106a is formed in the central part is formed a film.

Figure 28:
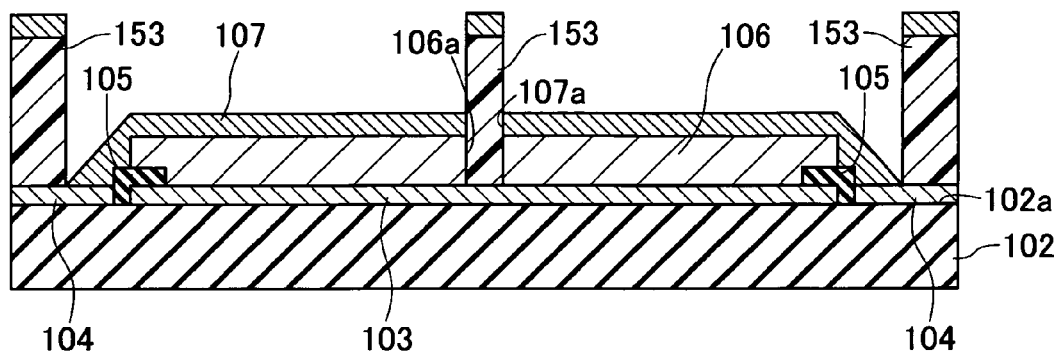
[FIG. 28] A diagram for explaining each fabricating process of the organic EL device according to the fifth embodiment

Next, as shown in FIG. 28, after forming the resist layer 153 in the peripheral part and the central part of the transmissible electrodes 103 and 104, the Al film which composes the cathode 107 is vapor-deposited. Then, the resist layer 153 is removed with the Al film formed on the top surface. Accordingly, the cathode 107 by which the apertural area 107a is formed in the central part is formed a film.

Figure 29:
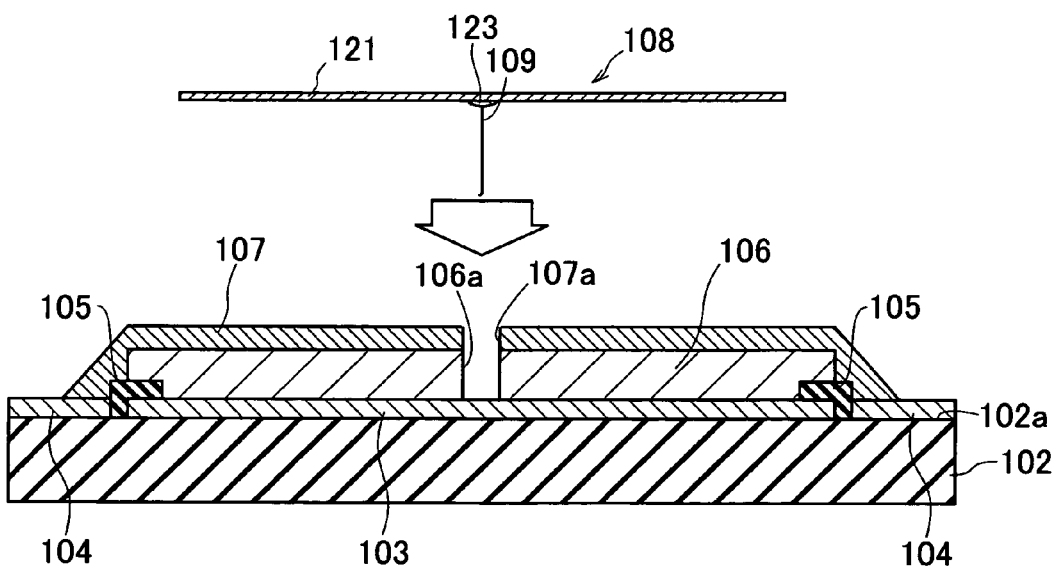
[FIG. 29] A diagram for explaining each fabricating process of the organic EL device according to the fifth embodiment
Figure 30:
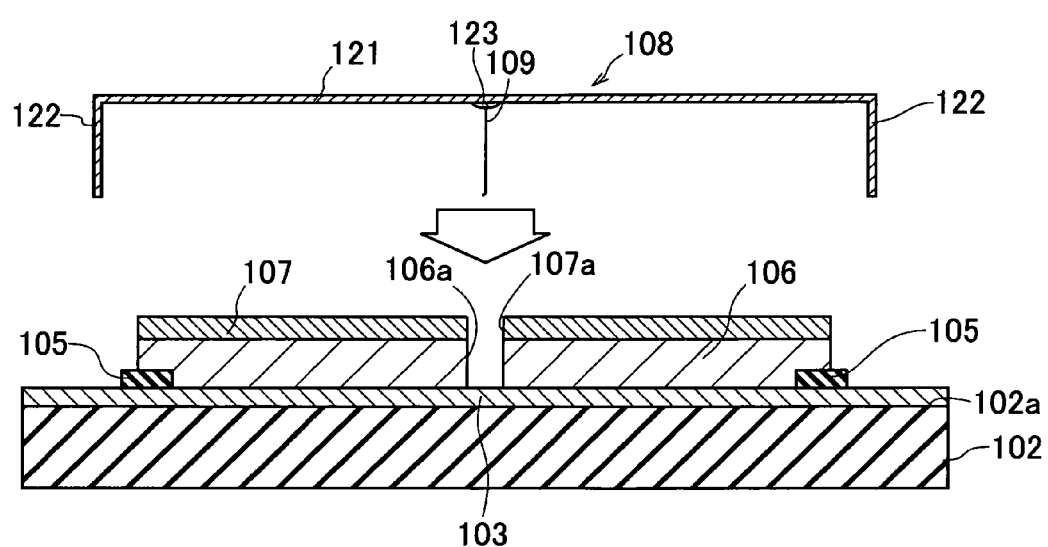
[FIG. 30] A diagram for explaining each fabricating process of the organic EL device according to the fifth embodiment

Next, as shown in FIG. 29 and FIG. 30, the feed unit member 108 bonded by the center of the convex connecting member 109 aligns to the substrate 102. In the stage, the edge part of the convex connecting member 109 is already flexibled so that it may be easy to bend. Then, the feed unit member 108 is brought close to the substrate 102 until the bottom surface of the leg part 122 contacts the 1st transmissible electrode 103. Accordingly, the tip region of the convex connecting member 109 is pressed to be flexibled on the top surface of the first transmissible electrode 103. As a result, the convex connecting member 109 and the first transmissible electrode 103 are connected. In the state, the bottom surface of the leg part 122 is fixed to the first transmissible electrode 103 by using the conductive jointing material, such as solder.

Finally, as shown in FIG. 22 and FIG. 23, the organic EL device 101 is completed by sealing the sealing member 110.

As mentioned above, in the organic EL device 101 according to the fifth embodiment, the hole injected into the anode terminal 112 provided in the peripheral part can be fed to the central part of the first transmissible electrode 103 (central part of the anode 111) by the feed unit member 108 and the convex connecting member 109. Accordingly, the hole can fully be injected also into the central part of the organic light emitting layer 106 where the hole was not fully injected only by the first transmissible electrode 103 having large resistance. Accordingly, the light-emitting in the central part of the organic light emitting layer 106 is increased, and the mottle of luminance distribution can be reduced.

Moreover, in the organic EL device 101, the feed unit member 108 and the convex connecting member 109 dispose at the opposite side of the first transmissible electrode 103 by sandwiching the organic light emitting layer 106. Accordingly, since the light emitted by the organic light emitting layer 106 does not shield, the extraction of light can be improved.

Moreover, the above-mentioned effect can be achieved in the organic EL device 101, without spoiling most emission areas of the organic light emitting layer 106 by applying the apertural areas 106a and 107a and the convex connecting member 109 into the first diameter.

Moreover, in the organic EL device 101, the convex connecting member 109 is easily connectable to the first transmissible electrode 103 by forming the apertural area 106a in the organic light emitting layer 106.

(Sixth Embodiment)

Figure 31:
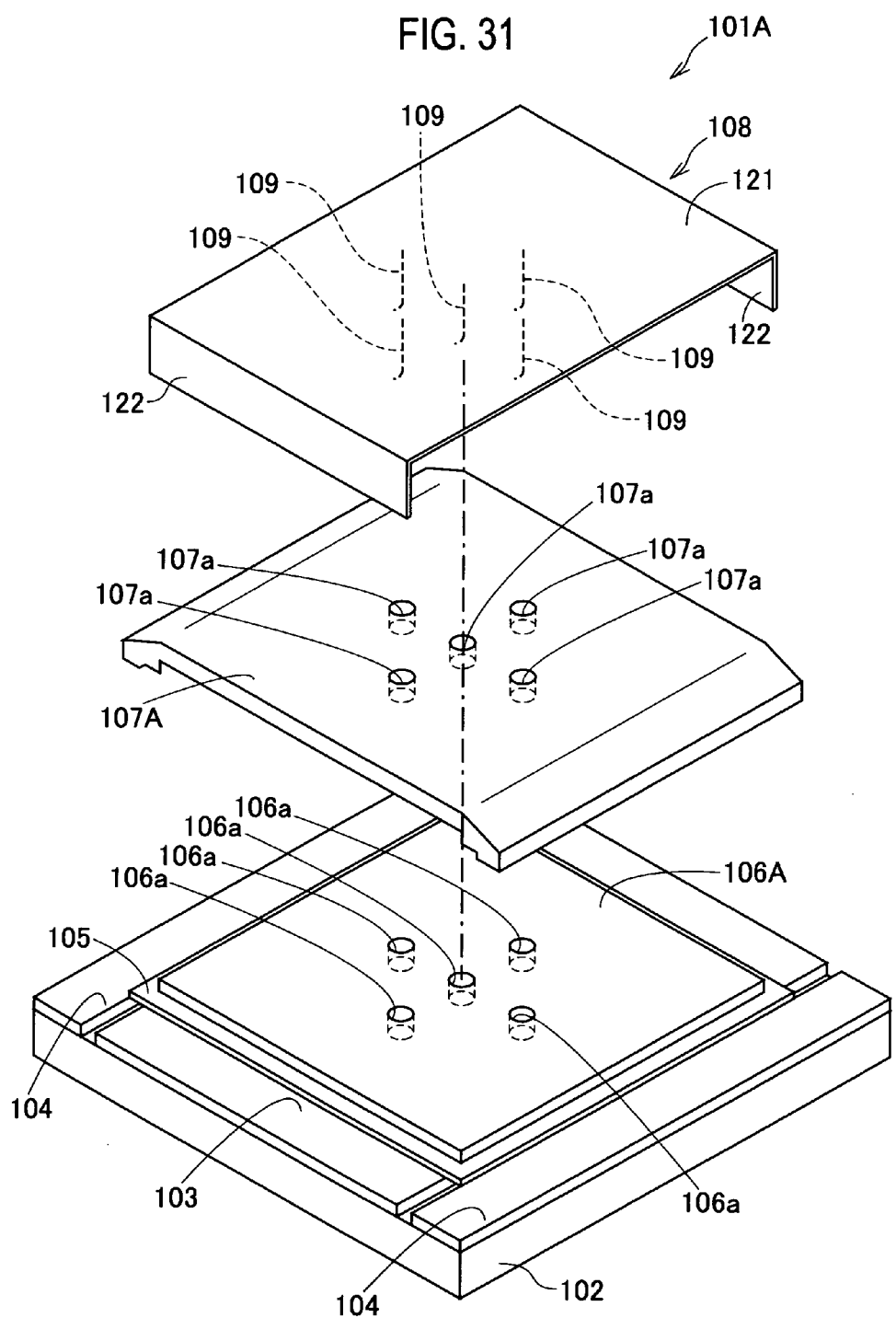
[FIG. 31] An exploded perspective diagram shown an organic EL device according to a sixth embodiment
Figure 32:
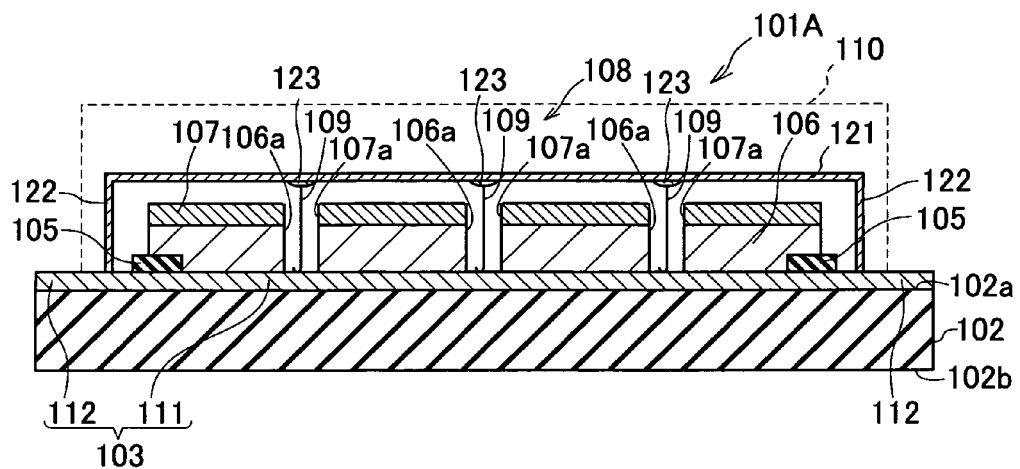
[FIG. 32] A cross-sectional diagram showing the organic EL device

Next, an organic EL device of a sixth embodiment that modified a part of the fifth embodiment mentioned above will be explained with reference to drawings. FIG. 31 is an exploded perspective diagram showing the organic EL device according to the sixth embodiment. FIG. 32 is a cross-sectional diagram showing the organic EL device. FIG. 32 is a cross-sectional diagram showing the same position as FIG. 22 in the fifth embodiment. In addition, the similar configuration as the fifth embodiment attaches the same reference numeral, and omits the explanation.

As shown in FIG. 31 and FIG. 32, in the organic EL device 101A according to the sixth embodiment, a plurality of (for example, five pieces) convex connecting member 109 is formed in the feed unit member 108. In this case, same number of the apertural area 106a of the organic light emitting layer 106A and the apertural area 107a of the cathode 107A is formed at the position corresponding to each convex connecting member 109. Here, the apertural area 106a of the organic light emitting layer 106A, the apertural area 107a of the cathode 107A, and the convex connecting member 109 are disposed around the center of the organic light emitting layer 106A in point symmetry or rotation symmetric position, according to plane view.

As mentioned above, in the organic EL device 101A according to the sixth embodiment, the hole injection into the central part of the first transmissible electrode 103 can be more enhanced by forming a plurality of convex connecting members 109. As a result, the light-emitting in the central part of the organic light emitting layer 106 is increased, and the mottle of luminance distribution can be more reduced. In addition, a plurality of apertural areas 106a and 107a and a plurality of convex connecting members 109 may be irregularly disposed in the surroundings of the center.

(Seventh Embodiment)

Figure 33:
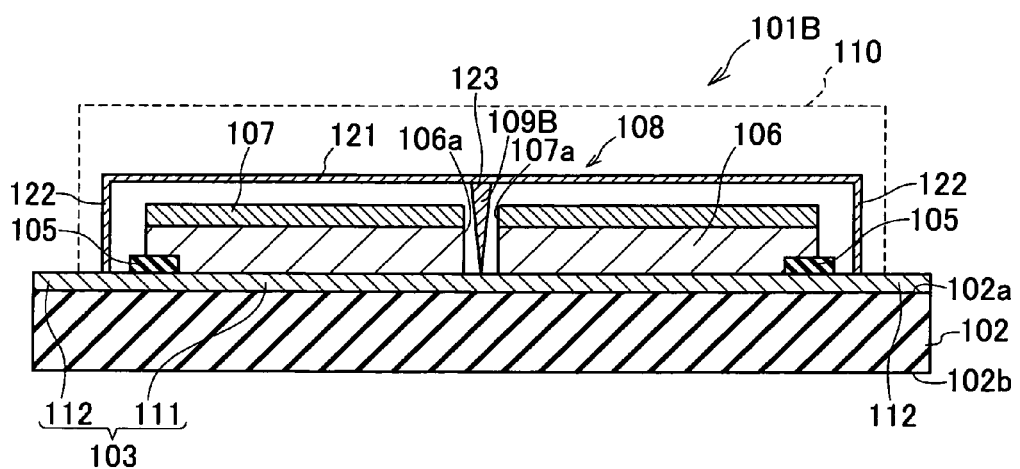
[FIG. 33] A cross-sectional diagram showing an organic EL device according to a seventh embodiment

Next, an organic EL device according to a seventh embodiment that modified a part of the embodiment mentioned above will be explained with reference to drawings. FIG. 33 is a cross-sectional diagram showing the organic EL device according to the seventh embodiment. FIG. 33 is a cross-sectional diagram showing the same position as FIG. 22 in the fifth embodiment. In addition, the similar configuration as the embodiment mentioned above attaches the same reference numeral, and omits the explanation.

As shown in FIG. 33, the convex connecting member 109B is formed in cone shape in the organic EL device 101B according to the seventh embodiment. Moreover, the convex connecting member 109B and the feed unit member 108 are integrally formed. The tip region of the convex connecting member 109B is thinly formed so as to flexible easily. Thus, as a method of forming thinly the tip region of the convex connecting member 109B, it is applicable to the fabrication method of probes, such as Atomic Force Microscope (AFM) and Scanning Tunneling Microscope (STM).

(Eighth Embodiment)

Figure 34:
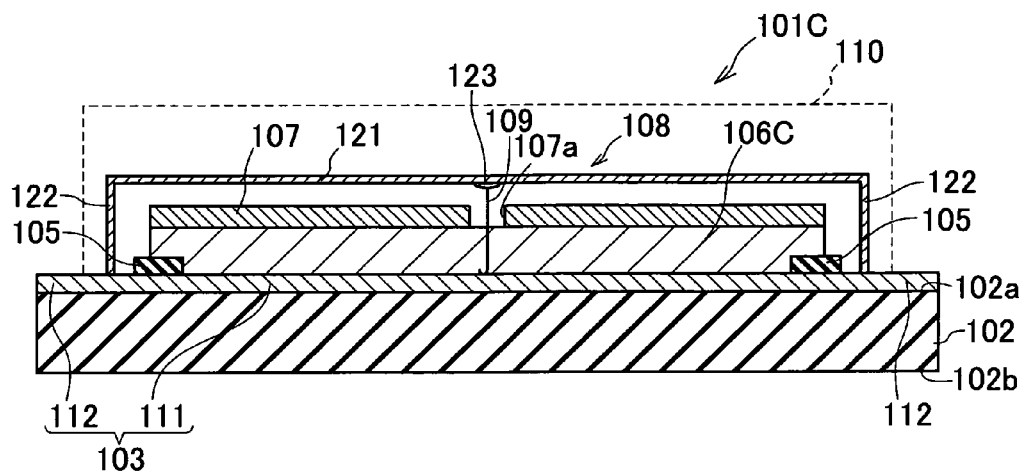
[FIG. 34] A cross-sectional diagram showing an organic EL device according to an eighth embodiment

Next, an organic EL device of an eighth embodiment that modified a part of the embodiment mentioned above will be explained with reference to drawings. FIG. 34 is a cross-sectional diagram showing the organic EL device according to the eighth embodiment. FIG. 34 is a cross-sectional diagram showing the same position as FIG. 22 in the fifth embodiment. In addition, the similar configuration as the embodiment mentioned above attaches the same reference numeral, and omits the explanation.

As shown in FIG. 34, the apertural area is not formed in the organic light emitting layer 106C in the organic EL device 101C according to the eighth embodiment. That is, the tip region of the convex connecting member 109 is connected with the first transmissible electrode 103 in the state embedded under the organic light emitting layer 106C. In addition, the apertural area 107a is formed in the cathode 107.

(Ninth Embodiment)

Figure 35:
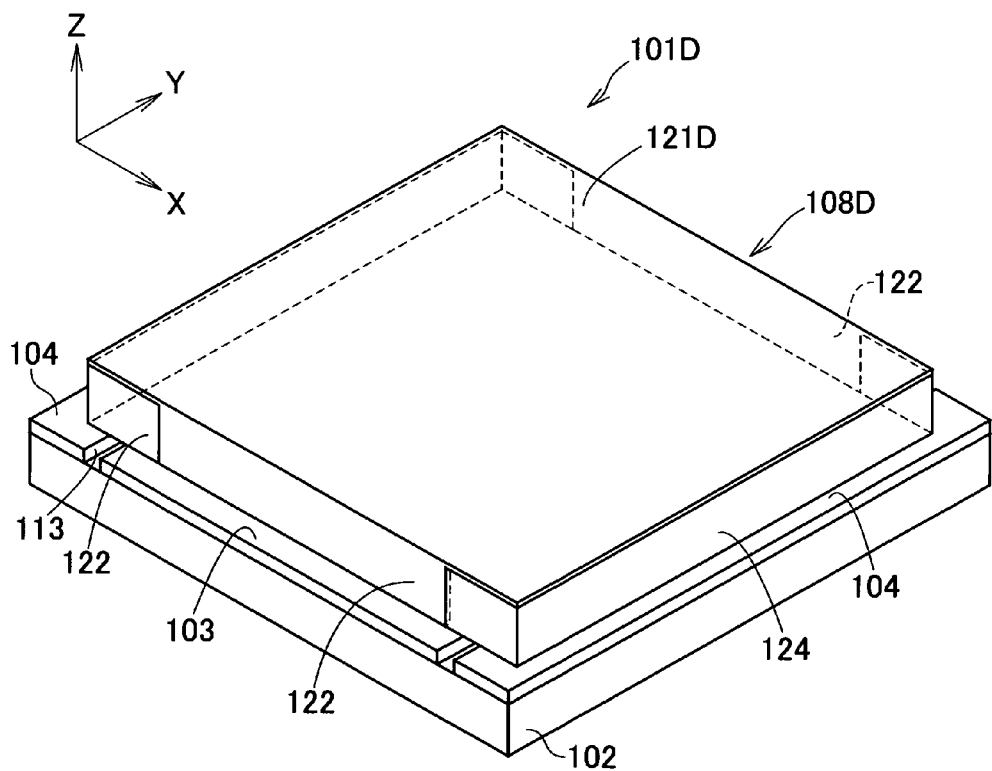
[FIG. 35] A whole perspective diagram showing an organic EL device according to a ninth embodiment
Figure 36:
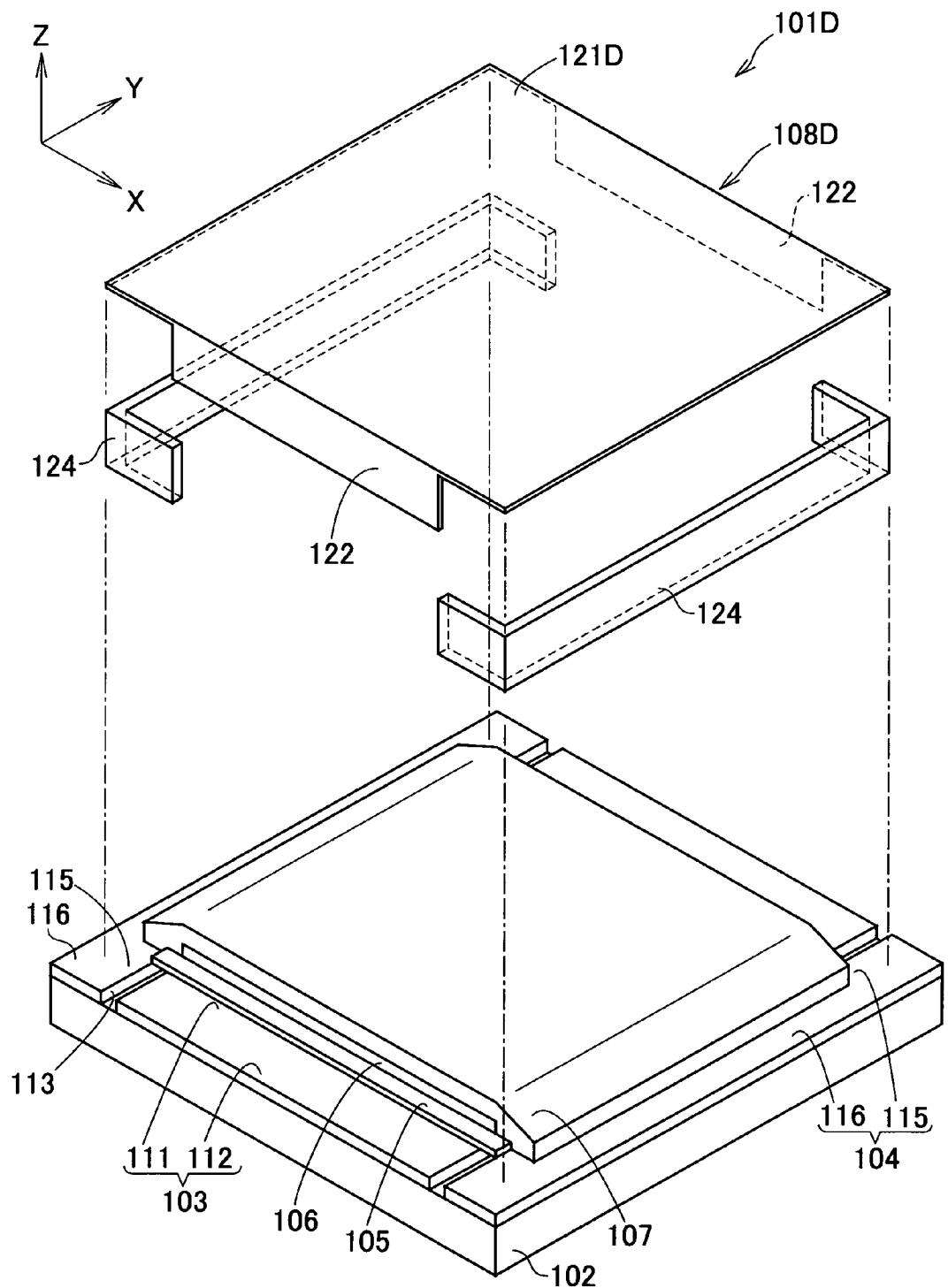
[FIG. 36] An exploded perspective diagram shown the organic EL device

Next, an organic EL device of a ninth embodiment that modified a part of the embodiment mentioned above will be explained with reference to drawings. FIG. 35 is a whole perspective diagram showing the organic EL device according to the ninth embodiment. FIG. 36 is an exploded perspective diagram showing the inside of the organic EL device. In addition, the similar configuration as the embodiment mentioned above attaches the same reference numeral, and omits the explanation.

As shown in FIG. 35 and FIG. 36, in the organic EL device 101D according to the ninth embodiment, the width of the direction X and the direction Y of the top plate part 121D of the feed unit member 108D is larger than the width of the direction X and the direction Y of the organic light emitting layer 106. That is, the top plate part 121D is wider than the organic light emitting layer 106. In the organic EL device 101D, the sealing material 124 composed of UV curing resin is provided. The sealing material 124 seals the region in which the leg part 122 is not formed and the second transmissible electrode 104 and the insulating trench 113 among the bottom surfaces of the peripheral part of the top plate part 121D. That is, the sealing material 124 is formed in the outside of the organic light emitting layer 106. Accordingly, the region in which the organic light emitting layer 106 is formed is sealed by the feed unit member 108D and the sealing material 124. As a result, the needed sealing member 110 in the fifth embodiment can be omitted and number of parts can be reduced.

(Tenth Embodiment)

Figure 37:
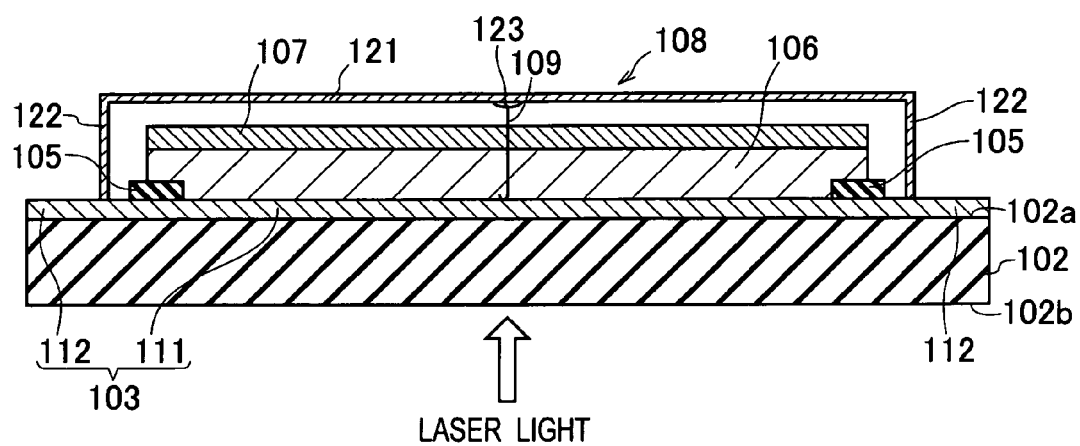
[FIG. 37] A cross-sectional diagram of the fabricating process for an organic EL device according to a tenth embodiment

Next, the organic EL device according to a tenth embodiment that modified a part of the fabrication method of the embodiment mentioned above will be explained with reference to drawings. FIG. 37 is a cross-sectional diagram showing a fabricating process for the organic EL device according to the tenth embodiment. FIG. 37 is a cross-sectional diagram showing the same position as FIG. 22 in the fifth embodiment. In addition, the similar configuration as the embodiment mentioned above attaches the same reference numeral, and omits the explanation.

As shown in FIG. 37, in the fabrication method for the organic EL device 101 according to the tenth embodiment, the feed unit member 108 and the convex connecting member 109 are mounted in the state where the apertural area is not formed in the organic light emitting layer 106 and the cathode 107. Then, the apertural areas 106a and 107a are formed in the organic light emitting layer 106 and the cathode 107 by irradiating laser light, such as YAG, to the surroundings of the convex connecting member 109 as shown in FIG. 22.

As mentioned above, although the present invention has been explained in detail using the embodiments, the present invention is not limited to the embodiments described in the specification. The scope of the present invention is determined by the description of scope of claims and the uniform scope of the description of scope of claims. Hereinafter, the modified embodiment into which the above-mentioned embodiment is modified partially is explained.

The numerical value, material, shape, etc. in each embodiment mentioned above can be modified suitably.

Also, although each embodiment mentioned above has been explained about the bottom emission type organic EL device as the examples, it may apply the present invention to a top emission type organic EL device.

Moreover, although the anode terminal and the cathode terminal are formed in the surroundings of the center of the organic light emitting layer at point symmetry in the embodiments mentioned above, it may be formed in the surroundings of the center of the organic light emitting layer at a rotation symmetric, and may be formed at axial symmetry by sandwiching the straight line which passes along the center of the organic light emitting layer.

Moreover, although the plate member of Al composed the feed unit member in the embodiments mentioned above, the member having the conductivity of other metal etc. may compose. Moreover, the thing which vapor-deposited metallic wiring for the feed unit member to the glass substrate etc. may be applied.

Moreover, in the above-mentioned embodiments, although the central part of the first transmissible electrode is applied as the anode, the central part of the first transmissible electrode may be used as the cathode. In this case, the metal electrode for covering the top surface of the organic light emitting layer is applied as the anode. Moreover, the electric charge fed by the first transmissible electrode fed by the feed unit member becomes the electron.

Moreover, although the convex connecting member is composed of the Al wire etc. in the embodiments mentioned above, the cantilever used for AFM etc. may be applied.

INDUSTRIAL APPLICABILITY

The present invention is applicable to organic EL devices, such as lighting.

Reference Signs List 1 and 1A: Organic EL device;
2 and 2C: Substrate;
2a: Growth principal surface;
2b: Light extraction surface;
3, 3A, 3B, and 3C: First transmissible electrode;
4, 4A, 4B, and 4C: Second transmissible electrode;
5: Insulating layer;
6: Organic light emitting layer;
7: Cathode;
8: Sealing material;
9: Sealing plate;
11, 11A, 11B, and 11C: Anode;
12, 12A, 12B, and 12C: Anode terminal;
12a, 12Aa, 12Ba, and 12Ca: Anode connecting surface;
13: Insulating trench;
15, 15A, 15B, and 15C: Connecting unit;
16, 16A, 16B, and 16C: Cathode terminal;
16a, 16Aa, 16Ba, and 16Ca: Cathode connecting surface;
C: Center;
S1: Size;
S2: Size;
101, 101A, 101B, and 101C: Organic EL device;
102: Substrate;
102a: Growth principal surface;
102b: Light extraction surface;
103: First transmissible electrode;
104: Second transmissible electrode;
105: Insulating layer;
106, 106A, and 106C: Organic light emitting layer;
106a: Apertural area;
107 and 107A: Cathode;
107a: Apertural area;

108: Feed unit member;
109 and 109B: Convex connecting member;
110: Sealing member;
111: Anode;
112: Anode terminal;
113: Insulating trench;
115: Connecting unit;
116: Cathode terminal;
121: Top plate part;
122: Leg part;
123: Jointing material; and
124: Sealing material.

The invention claimed is:

1. An organic EL device comprising:
a substrate having a plurality of sides that form a polygon;
a light emitting unit formed on the substrate, and including
a first electrode of a first surface shape,
a second electrode of a second surface shape and having an electric resistance lower than that of the first electrode, and
an organic light emitting layer formed between the first electrode and the second electrode;
a first external terminal formed on the substrate and connected to the first electrode, the first external terminal being formed along one of said sides; and
a second external terminal formed on the substrate and connected to the second electrode, the second external terminal being formed at a vertex formed between said sides, wherein
a first connecting surface of the first external terminal is connected to external power that is applied to the first connecting surface,
a second connecting surface of the second external terminal is connected to external power that is applied to the second connecting surface, and
a size of the first connecting surface is larger than a size of the second connecting surface.

2. The organic EL device according to claim 1, wherein the first external terminal and the second external terminal are symmetrical with respect to the center of the organic light emitting layer or with respect to a straight line passing along the center.

3. The organic EL device according to claim 1, wherein the first electrode is formed on the substrate, and the first electrode and the first external terminal are integrally formed with a same material.

4. The organic EL device according to claim 1, wherein the first external terminal and the second external terminal are formed with a same material.

5. The organic EL device according to claim 1, wherein the first electrode is a transmissible electrode capable of transmitting light, and
the second electrode is a metal electrode.

6. The organic EL device according to claim 1, wherein the first external terminal includes a plurality of terminals that are formed along all of said sides.

7. The organic EL device according to claim 1, wherein the second external terminal includes a plurality of terminals that are formed at all vertexes formed between said sides.

8. The organic EL device according to claim 1, wherein the second external terminal includes a plurality of terminals that are each L-shaped.

9. The organic EL device according to claim 1, wherein a distance between the first external terminal and the center of the organic light emitting layer is shorter than a distance between the second external terminal and the center of the organic light emitting layer.

10. The organic EL device according to claim 1, wherein all of the first external terminal is disposed closer to the center of the organic light emitting layer than any part of the second external terminal.

11. An organic EL device comprising:
a substrate;
a first electrode formed on the substrate and capable of transmitting light;
an organic light emitting layer formed on the first electrode;
a second electrode formed on the organic light emitting layer and having an electrode apertural area formed in a region, the organic light emitting layer being formed in the region;
a conductive feed unit member disposed in an upper side of the second electrode by spacing gaps, and connected to the first electrode at an outside of the organic light emitting layer; and
a convex connecting member inserted in the electrode apertural area so as to not contact the second electrode, and connected to the first electrode and the feed unit member.

12. The organic EL device according to claim 11, wherein the electrode apertural area formed in the second electrode is formed in a position corresponding to a center of the organic light emitting layer.

13. The organic EL device according to claim 11, wherein
a plurality of the electrode apertural areas are formed in the second electrode, and
the convex connecting member is inserted in each of the electrode apertural areas.

14. The organic EL device according to claim 13, wherein the plurality of the electrode apertural areas are symmetrical with respect to the center of the organic light emitting layer or with respect to a straight line passing along the center.

15. The organic EL device according to claim 11, wherein an emitting layer apertural area is formed in a position corresponding to the electrode apertural area in the organic light emitting layer.

16. The organic EL device according to claim 11, wherein the convex connecting member is capable of elastic deformation.

17. The organic EL device according to claim 11, wherein the convex connecting member and the feed unit member are integrally formed.

18. The organic EL device according to claim 11, wherein the feed unit member includes a conductive top plate part that is wider than the organic light emitting layer, and further includes a sealing material for sealing a peripheral part of the top plate part at a region outside of the organic light emitting layer.

19. The organic EL device according to claim 9, wherein the polygon that said sides form is a square.

* * * * *